US011985804B2

(12) United States Patent
Bhat et al.

(10) Patent No.: US 11,985,804 B2
(45) Date of Patent: May 14, 2024

(54) PACKAGE COMPRISING A BLOCK DEVICE WITH A SHIELD AND METHOD OF FABRICATING THE SAME

(71) Applicant: QUALCOMM Incorporated, San Diego, CA (US)

(72) Inventors: Anirudh Bhat, San Diego, CA (US); Jay Scott Salmon, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 125 days.

(21) Appl. No.: 17/383,241

(22) Filed: Jul. 22, 2021

(65) Prior Publication Data
US 2023/0023868 A1 Jan. 26, 2023

(51) Int. Cl.
| H05K 9/00 | (2006.01) |
| H05K 1/02 | (2006.01) |
| H05K 1/18 | (2006.01) |
| H05K 3/28 | (2006.01) |

(52) U.S. Cl.
CPC ........... *H05K 9/0032* (2013.01); *H05K 1/023* (2013.01); *H05K 1/188* (2013.01); *H05K 3/284* (2013.01); *H05K 2201/0715* (2013.01); *H05K 2203/1377* (2013.01)

(58) Field of Classification Search
CPC .... H05K 1/18; H05K 1/181–188; H05K 1/02; H05K 1/023; H05K 9/00; H05K 9/0032; H05K 3/284; H01L 23/552; H01L 23/49812; H01L 23/3135
USPC ................ 361/764–767, 784, 795, 816, 818; 257/659–690, 787–790
See application file for complete search history.

(56) References Cited

U.S. PATENT DOCUMENTS

| 10,510,733 | B2 | 12/2019 | Kumar et al. |
| 2015/0366063 | A1* | 12/2015 | Takagi ............. H01L 23/49811 29/831 |
| 2018/0182691 | A1* | 6/2018 | Cho .................. H01L 24/20 |
| 2019/0081027 | A1 | 3/2019 | Kumar et al. |
| 2019/0131212 | A1* | 5/2019 | Baek ................ H01L 23/642 |
| 2019/0189583 | A1* | 6/2019 | Baek ................ H01L 24/24 |
| 2019/0206813 | A1* | 7/2019 | Kim ................. H01L 23/12 |
| 2019/0273079 | A1 | 9/2019 | Gong et al. |
| 2019/0273312 | A1* | 9/2019 | Otsubo .............. H01Q 1/38 |
| 2019/0274237 | A1* | 9/2019 | Otsubo .............. H05K 3/284 |
| 2019/0393166 | A1* | 12/2019 | Otsubo ............. H01L 23/552 |
| 2020/0161252 | A1* | 5/2020 | Yang ................ H01L 21/561 |
| 2020/0196495 | A1* | 6/2020 | Kang ................ H05K 1/0216 |
| 2021/0091017 | A1* | 3/2021 | Yeon ................ H01L 24/16 |
| 2021/0280959 | A1* | 9/2021 | Han ................. H01Q 1/36 |

OTHER PUBLICATIONS

International Search Report and Written Opinion—PCT/US2022/033023—ISA/EPO—dated Oct. 11, 2022.

* cited by examiner

*Primary Examiner* — Tuan T Dinh
(74) *Attorney, Agent, or Firm* — Loza & Loza, LLP

(57) ABSTRACT

A package that includes a substrate, a first integrated device coupled to the substrate, a first block device coupled to the substrate, a second encapsulation layer encapsulating the first integrated device and the first block device. The first block device includes a first electrical component, a second electrical component, a first encapsulation layer at least partially encapsulating the first electrical component and the second electrical component, and a first metal layer coupled to the first encapsulation layer.

27 Claims, 18 Drawing Sheets

CROSS SECTIONAL PROFILE VIEW

CROSS SECTIONAL PROFILE VIEW

CROSS SECTIONAL PLAN VIEW

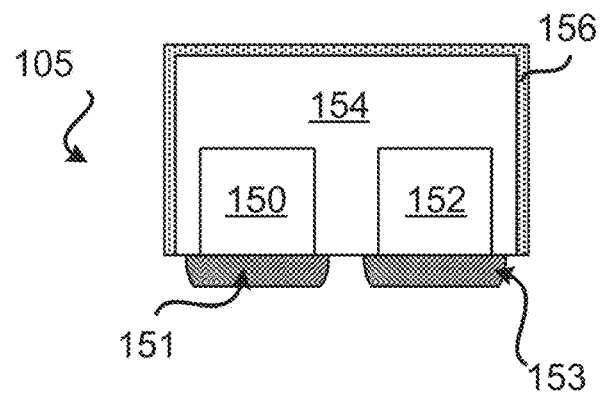
FIG. 3
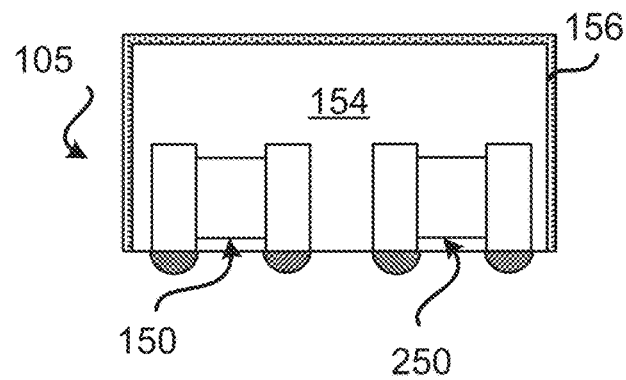
FIG. 4
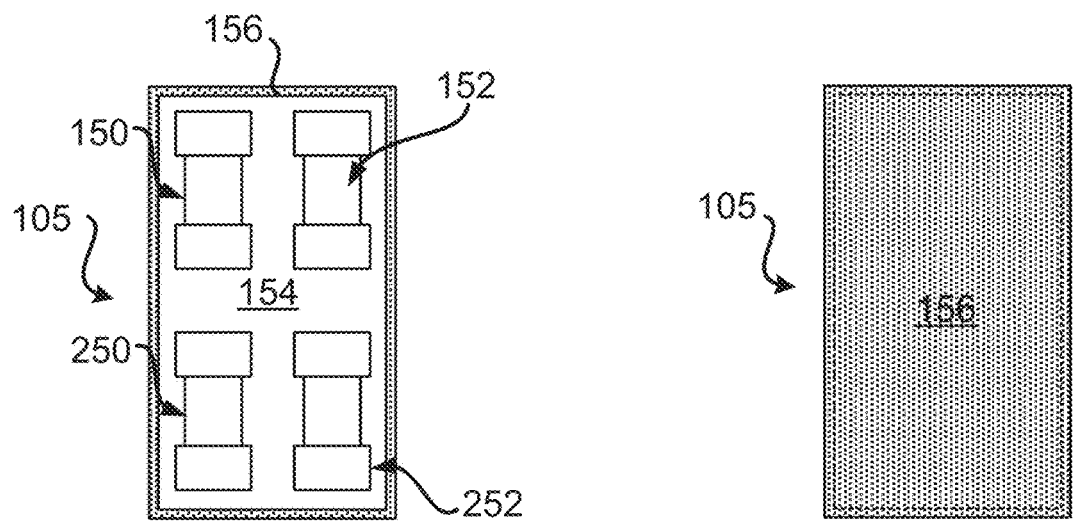
FIG. 5
FIG. 6

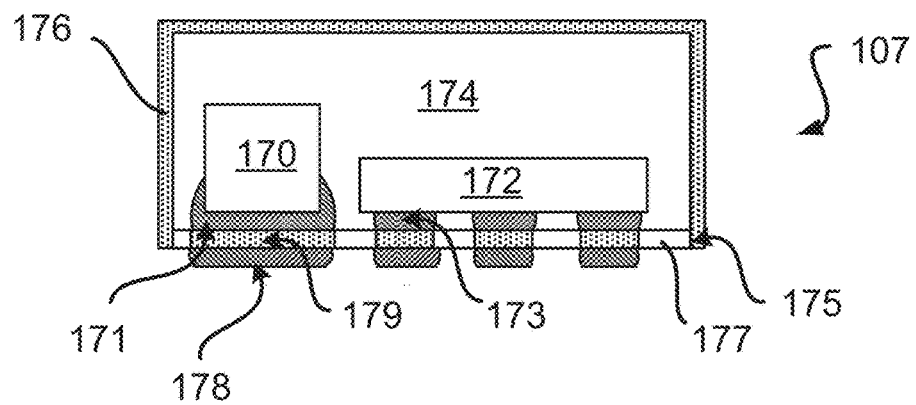
FIG. 7
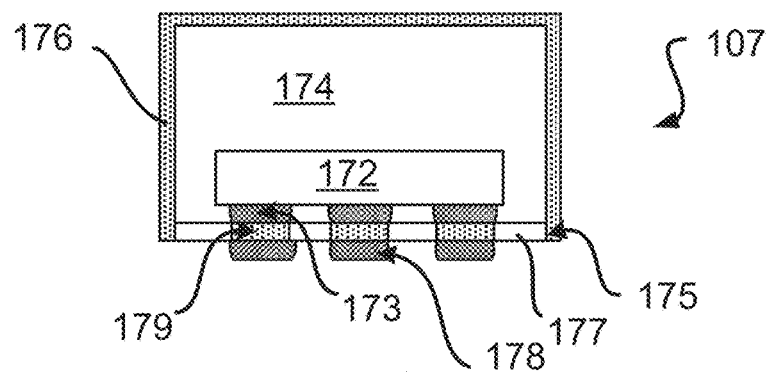
FIG. 8
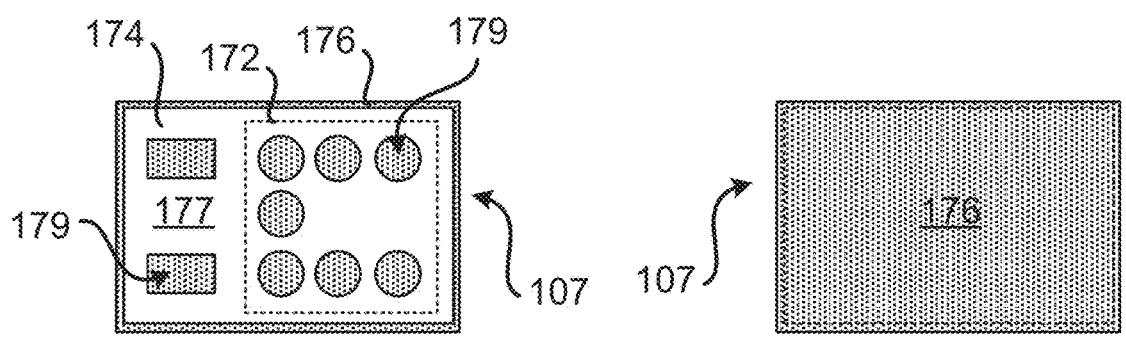
FIG. 9
FIG. 10

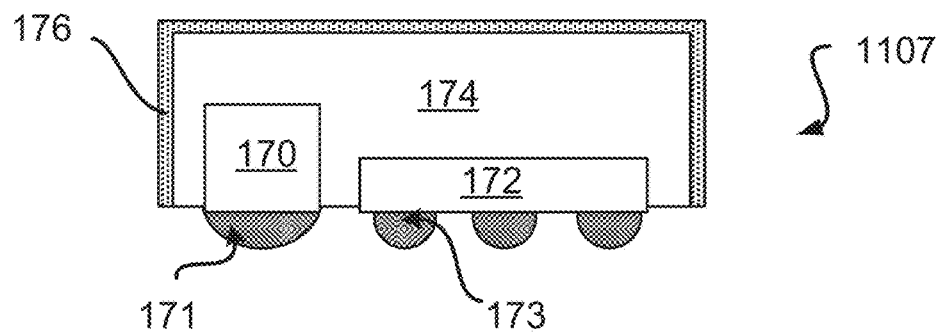
FIG. 11
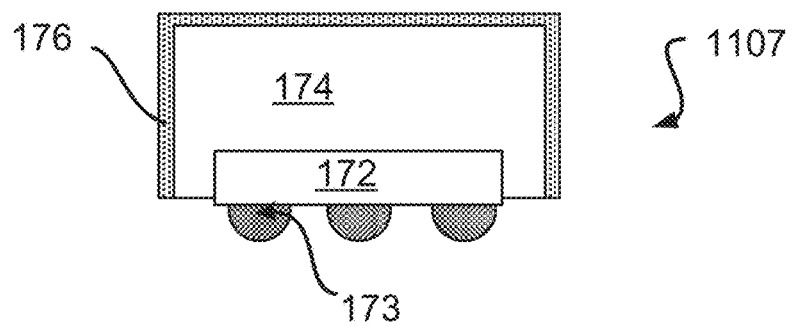
FIG. 12
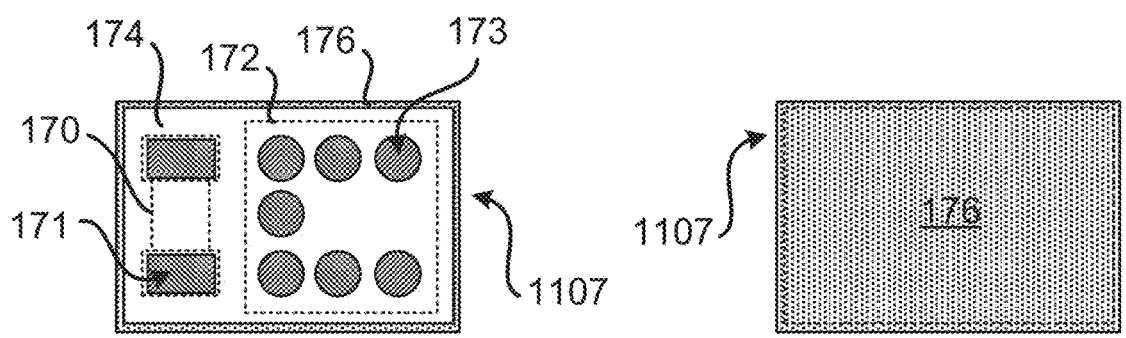
FIG. 13                     FIG. 14

PACKAGE COMPRISING A BLOCK DEVICE WITH A SHIELD AND METHOD OF FABRICATING THE SAME

FIELD

Various features relate to packages with integrated devices.

BACKGROUND

A package may include a substrate and integrated devices. These components are coupled together to provide a package that may perform various electrical functions. Electromagnetic interference (EMI) can impact the overall performance of the components and the package. There is an ongoing need to provide better performing packages and reduce the impact of the EMI in and around packages.

SUMMARY

Various features relate to packages with integrated devices.

One example provides a package that includes a substrate, a first integrated device coupled to the substrate, a first block device coupled to the substrate, a second encapsulation layer at least partially encapsulating the first integrated device and the first block device. The first block device includes a first electrical component, a second electrical component, a first encapsulation layer encapsulating the first electrical component and the second electrical component, and a first metal layer coupled to the first encapsulation layer.

Another example provides an apparatus that includes a substrate, a first integrated device coupled to the substrate, a first block device coupled to the substrate, a means for second encapsulation configured to at least partially encapsulate the first integrated device and the first block device. The first block device includes a first electrical component, a second electrical component, a means for first encapsulation configured to encapsulate the first electrical component and the second electrical component, and a first metal layer coupled to the means for first encapsulation.

Another example provides a method for fabricating a package. The method provides a substrate. The method couples a first integrated device to the substrate. The method couples a first block device to the substrate. The first block device includes a first electrical component, a second electrical component, a first encapsulation layer encapsulating the first electrical component and the second electrical component, and a first metal layer coupled to the first encapsulation layer. The method forms a second encapsulation layer that at least partially encapsulates the first integrated device and the first block device.

BRIEF DESCRIPTION OF THE DRAWINGS

Various features, nature and advantages may become apparent from the detailed description set forth below when taken in conjunction with the drawings in which like reference characters identify correspondingly throughout.

FIG. 3 illustrates a cross sectional side profile view of a block device with a shield.

FIG. 4 illustrates another cross-sectional side profile view of a block device with a shield.

FIG. 5 illustrates a bottom plan view of a block device with a shield.

FIG. 6 illustrates a top plan view of a block device with a shield.

FIG. 7 illustrates a cross-sectional side profile view of a block device with a shield and a block substrate.

FIG. 8 illustrates another cross-sectional side profile view of a block device with a shield and a block substrate.

FIG. 9 illustrates a bottom plan view of a block device with a shield and a block substrate.

FIG. 10 illustrates a top plan view of a block device with a shield and a block substrate.

FIG. 11 illustrates a cross sectional side profile view of a block device with a shield.

FIG. 12 illustrates another cross-sectional side profile view of a block device with a shield.

FIG. 13 illustrates a bottom plan view of a block device with a shield.

FIG. 14 illustrates a top plan view of a block device with a shield.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Figure 1:
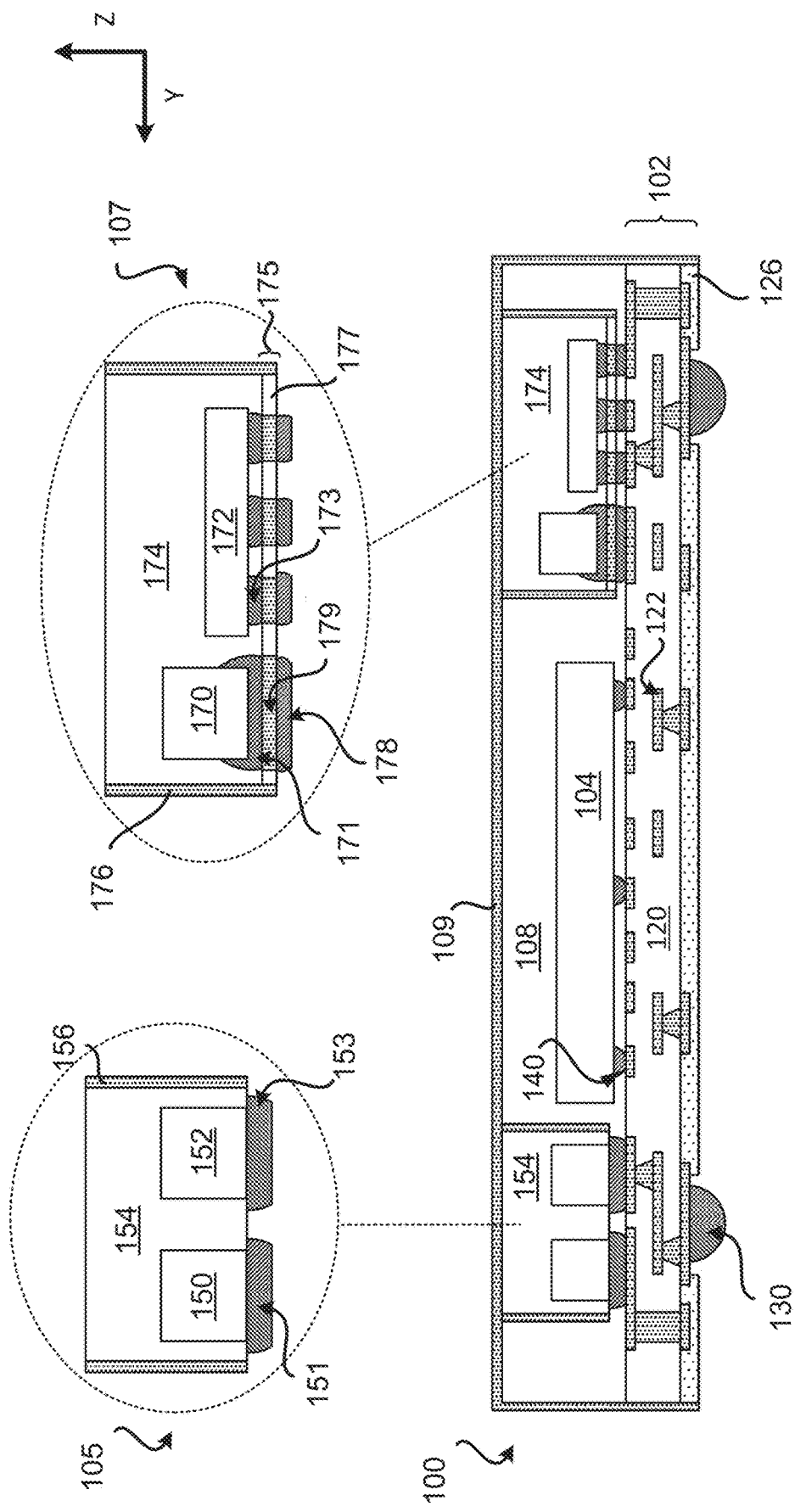
FIG. 1 illustrates a cross sectional profile view of a package that includes at least one block device with a shield.

The present disclosure describes a package that includes a substrate, a first integrated device coupled to the substrate, a first block device coupled to the substrate, a second encapsulation layer at least partially encapsulating the first integrated device and the first block device. The first block device includes a first electrical component (e.g., first electrical device), a second electrical component (e.g., second electrical device), a first encapsulation layer encapsulating the first electrical component and the second electrical component, and a first metal layer coupled to the first encapsulation layer, wherein the first metal layer is configured as a shield (e.g., electromagnetic interference (EMI) shield) for the first block device. Examples of electrical components (e.g., electrical device) include a passive component (e.g., capacitor) and/or an integrated device (e.g., semiconductor die). Using block devices that have a shield helps provide shielding for the block devices and/or other components (e.g., first integrated device) in the package. For example, the shield for the first block device may be configured as a shield for the first integrated device, helping prevent a current passing through the first block device from interfering with a current passing through the first integrated device of the package, and/or helping prevent a current passing through the first integrated device of the package from interfering with a passing through the first block device. In addition, the configuration of the package may also help decrease the size and/or the footprint of the package, while still providing improved package performance Exemplary Package Comprising a Block Device and a Shield FIG. 1 illustrates a cross sectional profile view of a package 100 that includes at least one block device with an electromagnetic interference (EMI) shield. The package 100 includes a substrate 102, an integrated device 104, a block device 105, a block device 107, an encapsulation layer 108, and a metal layer 109. The block device 105 and/or the block device 107 may be examples of shielded block devices.

The substrate 102 includes at least one dielectric layer 120, a plurality of interconnects 122 and a solder resist layer 126. The substrate 102 may include a first surface (e.g., top surface) and a second surface (e.g., bottom surface). A plurality of solder interconnects 130 may be coupled to the substrate 102. For example, the plurality of solder interconnects 130 may be coupled to the plurality of interconnects 122.

The integrated device 104 is coupled to a first surface of the substrate 102 through a plurality of solder interconnects 140. The block device 105 may be a first block device. The block device 105 is coupled to the first surface of the substrate 102 through a plurality of solder interconnects 151 and/or a plurality of solder interconnects 153. The block device 105 is coupled to the plurality of interconnects 122 through a plurality of solder interconnects 151 and/or a plurality of solder interconnects 153. The block device 107 may be a second block device. The block device 107 is coupled to the first surface of the substrate 102 through a plurality of solder interconnects 178. The block device 107 is coupled to the plurality of interconnects 122 through a plurality of solder interconnects 178.

The encapsulation layer 108 may be a second encapsulation layer. The encapsulation layer 108 may be located over and/or around the integrated device 104, the block device 105, the block device 107 and/or the substrate 102. The encapsulation layer 108 may at least partially encapsulate the integrated device 104, the block device 105 and the block device 107. The encapsulation layer 108 may include a mold, a resin and/or an epoxy. The encapsulation layer 108 may be a means for encapsulation (e.g., means for second encapsulation). The encapsulation layer 108 may be provided by using a compression and transfer molding process, a sheet molding process, or a liquid molding process.

The metal layer 109 may be a second metal layer. The metal layer 109 is located and coupled to an outer surface of the encapsulation layer 108. For example, the metal layer 109 may be located over a top portion and/or a side portion of the outer surface of the encapsulation layer 108. The metal layer 109 may be located over a side portion of the substrate 102. The metal layer 109 may include one or more metal layers. As will be further described below, the metal layer 109 may be coupled to a metal layer of the block device 105 and/or a metal layer of the block device 107. The metal layer 109 may be configured to be coupled to ground. The metal layer 109 may be configured as an EMI shield (e.g., means for EMI shield) for the package 100. For example, the metal layer 109 may be configured as a conformal shield for the package 100. The metal layer 109 may help prevent signals outside of the package 100 from interfering with currents and/or signals traveling inside the package 100.

The block device 105 includes at least two electrical components (e.g., at least two electrical devices). The block device 107 includes at least two electrical components (e.g., at least two electrical devices). Examples of electrical components (e.g., electrical devices) include a passive component (e.g., capacitor) and/or an integrated device (e.g., semiconductor die).

The block device 105 includes a passive component 150 (e.g., first capacitor), a passive component 152 (e.g., second capacitor), an encapsulation layer 154 and a metal layer 156. The passive component 150 may be an example of a first electrical component. The passive component 152 may be an example of a second electrical component. The encapsulation layer 154 may encapsulate the passive component 150 and the passive component 152. The encapsulation layer 154 may be a first encapsulation layer. The encapsulation layer 154 may include a mold, a resin and/or an epoxy. The encapsulation layer 154 may be a means for encapsulation (e.g., means for first encapsulation).

The metal layer 156 may be coupled to the encapsulation layer 154. The metal layer 156 may be coupled to the side surface of the block device 105. The metal layer 156 may be a first metal layer. The metal layer 156 may be configured to be coupled to ground. The metal layer 156 may be configured as an EMI shield (e.g., means for EMI shield) for the block device 105. The metal layer 156 may be configured as an EMI shield for the package 100. The metal layer 156 may provide shielding for the passive component 150 and/or the passive component 152. The metal layer 156 may also provide shielding for the integrated device 104 (and/or any other component in the package 100). For example, the metal layer 156 may help prevent current traveling through the passive component 150 and/or the passive component 152 from interfering with currents and/or signals traveling through the integrated device 104, and vice versa. The metal layer 156 may be configured as a compartmental shield for the package 100. The metal layer 156 may help prevent signals outside of the package 100 from interfering with currents and/or signals traveling inside the block device 105. The metal layer 156 may be coupled to the metal layer 109.

The block device 107 includes a block substrate 175, a passive component 170 (e.g., first capacitor), an integrated device 172, an encapsulation layer 174 and a metal layer 176. The passive component 170 may be an example of a first electrical component. The integrated device 172 (e.g., semiconductor die) may be an example of a second electrical component. The encapsulation layer 174 may encapsulate the passive component 170 and the integrated device 172. The encapsulation layer 174 may be a third encapsulation layer. The encapsulation layer 174 may include a mold, a resin and/or an epoxy. The encapsulation layer 174 may be a means for encapsulation (e.g., means for third encapsulation). The encapsulation layer 174 may be located over the block substrate 175, the passive component 170 and the integrated device 172.

The block substrate 175 includes at least one dielectric layer 177 and a plurality of interconnects 179 (e.g., block substrate interconnects). Different implementations may use different materials for the at least one dielectric layer 177. For example, the at least one dielectric layer 177 may include glass, quartz and/or prepreg. The passive component 170 is coupled to the block substrate 175 through a plurality of solder interconnects 171. The integrated device 172 is coupled to the block substrate 175 through a plurality of solder interconnects 173. The block substrate 175 may be configured to at least partially provide EMI shielding. That is, some interconnects from the plurality of interconnects 179 may be configured as an EMI shield. Some interconnects from the plurality of interconnects 179 may be configured to be coupled to ground. Some interconnects from the plurality of interconnects 179 may be coupled to the metal layer 176. The block device 107 is coupled to the plurality of interconnects 122 of the substrate 102 through the plurality of solder interconnects 178. The plurality of solder interconnects 178 may be coupled to the plurality of interconnects 179 of the block substrate 175.

The metal layer 176 may be coupled to the encapsulation layer 174. The metal layer 176 may be coupled to the side surface of the block device 107. The metal layer 176 may be coupled to some interconnects from the plurality of interconnects 179 of the block substrate 175. The metal layer 176 may be a first metal layer. The metal layer 176 may be configured to be coupled to ground. The metal layer 176 may be configured as an EMI shield (e.g., means for EMI shield) for the block device 107. The metal layer 176 may be configured as an EMI shield for the package 100. The metal layer 176 may provide shielding for the passive component 170 and/or the integrated device 172. The metal layer 176 may also provide shielding for the integrated device 104 (and/or any other component in the package 100). For example, the metal layer 176 may help prevent current traveling through the passive component 170 and/or the integrated device 172 from interfering with currents and/or signals traveling through the integrated device 104, and vice versa. The metal layer 176 may be configured as a compartmental shield for the package 100. The metal layer 176 may help prevent signals outside of the package 100 from interfering with currents and/or signals traveling inside the block device 107. The metal layer 176 may be coupled to the metal layer 109.

Figure 2:
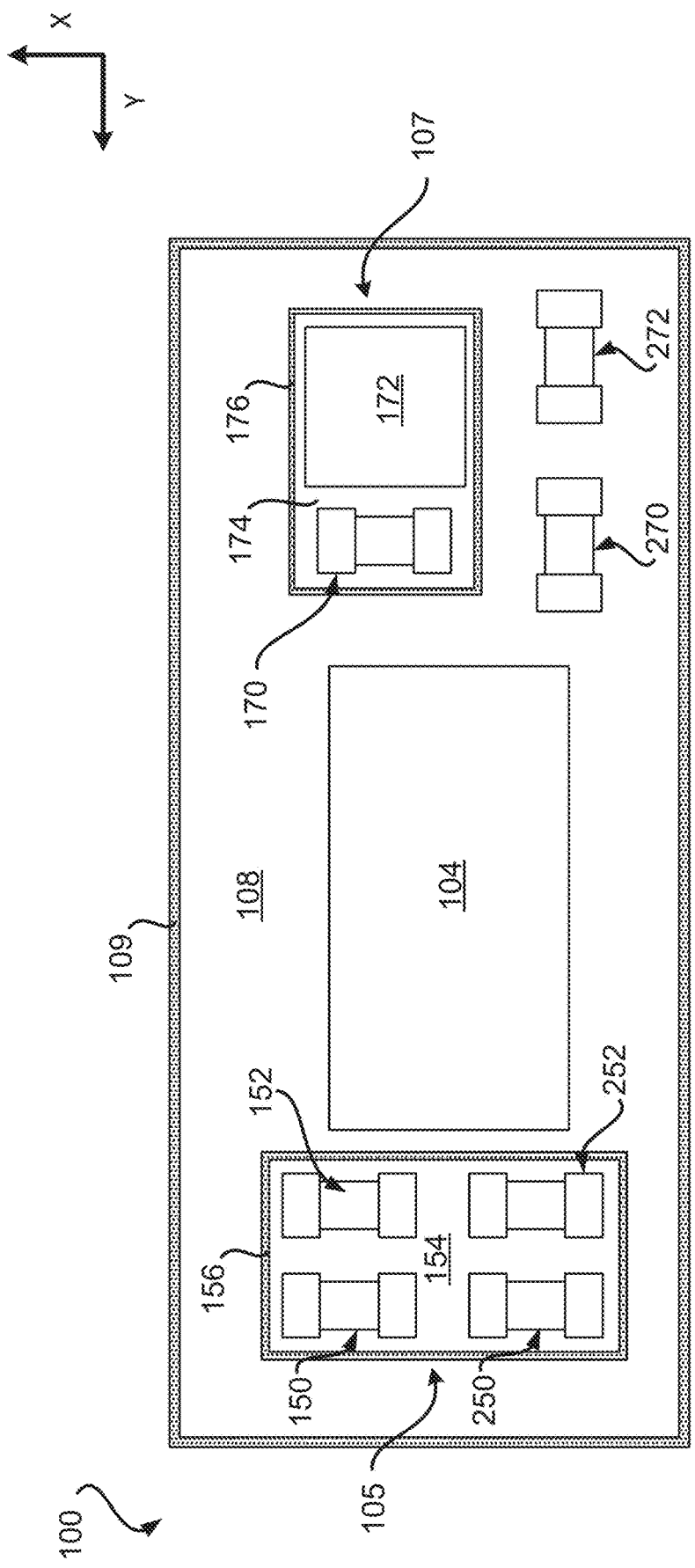
FIG. 2 illustrates a cross sectional plan view of a package that includes at least one block device with a shield.

FIG. 2 illustrates a cross sectional plan view of the package 100. As shown in FIG. 2, the package 100 includes the integrated device 104, the block device 105, the block device 107, the passive component 270, the passive component 272, the encapsulation layer 108 and the metal layer 109. The integrated device 104, the block device 105, the block device 107, the passive component 270 and the passive component 272 are coupled to the substrate 102 (not shown in FIG. 2). The encapsulation layer 108 at least partially encapsulates the integrated device 104, the block device 105, the block device 107, the passive component 270 and the passive component 272. The encapsulation layer 108 may be located over the substrate 102, the integrated device 104, the block device 105, the block device 107, the passive component 270 and/or the passive component 272.

The block device 105 includes the passive component 150, the passive component 152, the passive component 250, the passive component 252, the encapsulation layer 154, and the metal layer 156. The encapsulation layer 154 encapsulates the passive component 150, the passive component 152, the passive component 250, and the passive component 252.

The block device 107 includes the passive component 170 and the integrated device 172, the encapsulation layer 174 and the metal layer 176.

The metal layer 156 laterally surround the encapsulation layer 154, the passive component 150, the passive component 152, the passive component 250, and the passive component 252. The metal layer 156 may shield the passive component 150, the passive component 152, the passive component 250, and the passive component 252 from the integrated device 104, the block device 107, the passive component 270 and/or the passive component 272. Similarly, the metal layer 156 may shield the integrated device 104, the block device 107, the passive component 270 and/or the passive component 272 from the passive component 150, the passive component 152, the passive component 250, and the passive component 252.

The metal layer 176 laterally surrounds the encapsulation layer 174, the passive component 170 and the integrated device 172. The metal layer 176 may shield the passive component 170 and the integrated device 172 from the integrated device 104, the block device 105, the passive component 270 and/or the passive component 272. Similarly, the metal layer 176 may shield the integrated device 104, the block device 105, the passive component 270 and/or the passive component 272 from the passive component 170 and the integrated device 172.

There are several advantages to the configuration of the package 100. One, using block devices with an EMI shield helps improve the performance of the package by reducing and/or eliminating interference between components from the package 100, and/or interference from components external to the package 100. Two, using block devices with an EMI shield helps provide more compact packages because components in the package 100 may be placed closer to each other in the package 100 without necessarily adversely affecting the performance of the package 100. Three, using block devices with pre-defined EMI shields simplifies the fabricating process during the assembly and fabrication of the package.

The EMI shields (e.g., metal layer 156, metal layer 176, metal layer 109) may be configured as faraday cages that provide electrical isolation between different circuit functions within a package. The use of a pre-applied compartment shield on these block devices may offer excellent shielding without significant changes to existing layout for a package. The EMI shield(s) may be means for shield (e.g., means for EMI shield).

It is noted that the package 100 may include different numbers of block devices, such as one or more block devices. Also, each block device may have different numbers of electrical components (e.g., electrical devices, passive component, integrated device) that are shielded from other components and/or devices of a package. Thus, the configuration of the package 100 shown in the disclosure is merely exemplary.

FIGS. 3-6 illustrate various views of the block device 105. FIG. 3 illustrates a side view of the block device 105 that includes the passive component 150, the passive component 152, the encapsulation layer 154, and the metal layer 156. A plurality of solder interconnects 151 is coupled to the passive component 150. A plurality of solder interconnects 153 is coupled to the passive component 152. In some implementations, the bottom portion of the passive component 150 and/or the bottom portion of the passive component 152 may be aligned with a bottom portion of the encapsulation layer 154. For example, the bottom surface of the passive component 150 and/or the bottom surface of the passive component 152 may be aligned with a bottom surface of the encapsulation layer 154. In some implementations, the passive component 150 and/or the passive component 152 may protrude out of the bottom surface of the encapsulation layer 154 such that part of the side portion of the passive component 150 and/or part of the side portion of the passive component 152 are not covered by the encapsulation layer 154. FIG. 4 illustrates another side view of the block device 105 that includes the passive component 150, the passive component 250, the encapsulation layer 154, and the metal layer 156.

FIG. 5 illustrates a bottom plan view of the block device 105 that includes the passive component 150, the passive component 152, the passive component 250, the passive component 252, the encapsulation layer 154, and the metal layer 156. A plurality of solder interconnects may be coupled to terminals of the passive component 150, the passive component 152, the passive component 250, and/or the passive component 252. FIG. 6 illustrates a top plan view of the block device 105 that includes the metal layer 156. The metal layer 156 is located over a surface of the encapsulation layer 154.

FIGS. 7-10 illustrate various views of the block device 107. FIG. 7 illustrates a side view of the block device 107 that includes the passive component 170, the integrated device 172, the block substrate 175, the encapsulation layer 174, and the metal layer 176. A plurality of solder interconnects 178 is coupled to the block substrate 175. The encapsulation layer 174 is located over the block substrate 175, the passive component 170, and the integrated device 172. The metal layer 176 is located over a surface of the encapsulation layer 174. The block substrate 175 includes at least one dielectric layer 177 and a plurality of interconnects 179. The plurality of solder interconnects 178 is coupled to some of the interconnects from the plurality of interconnects 179. FIG. 8 illustrates another side view of the block device 107 that includes the passive component 170, the integrated device 172, the block substrate 175, the encapsulation layer 174, and the metal layer 176.

FIG. 9 illustrates a bottom plan view of the block device 107 that includes the passive component 170, the integrated device 172, the block substrate 175 (which includes the at least one dielectric layer 177 and the plurality of interconnects 179), the encapsulation layer 174, and the metal layer 176. A plurality of solder interconnects may be coupled to some interconnects from the plurality of interconnects 179. FIG. 10 illustrates a top plan view of the block device 107 that includes the metal layer 176. The metal layer 176 is located over a surface of the encapsulation layer 174.

In some implementations, the block device 107 may be implemented without the block substrate 175. In some implementations, the block device 105 may be implemented with the block substrate 175, as described for the block device 107.

FIGS. 11-14 illustrate various views of a block device 1107. The block device 1107 may be implemented in any package (e.g., 100). The block device 1107 may be similar to the block device 107. However, the block device 1107 does not include the block substrate 175. FIG. 11 illustrates a side view of the block device 1107 that includes the passive component 170, the integrated device 172, the encapsulation layer 174, and the metal layer 176. A plurality of solder interconnects 171 is coupled to the passive component 170. A plurality of solder interconnects 173 is coupled to the integrated device 172. In some implementations, the passive component 170 and/or the integrated device 172 may protrude out of the bottom surface of the encapsulation layer 174 such that part of the side portion of the passive component 170 and/or part of the side portion of the integrated device 172 are not covered by the encapsulation layer 174. In some implementations, the bottom portion of the passive component 170 and/or the bottom portion of the integrated device 172 152 may be aligned with a bottom portion of the encapsulation layer 174. For example, the bottom surface of the passive component 170 and/or the bottom surface of the integrated device 172 may be aligned with a bottom surface of the encapsulation layer 174. FIG. 12 illustrates another side view of the block device 1107 that includes the passive component 170, the integrated device 172, the encapsulation layer 174, and the metal layer 176.

FIG. 13 illustrates a bottom plan view of the block device 1107 that includes the passive component 170, the integrated device 172, the encapsulation layer 174, and the metal layer 176. A plurality of solder interconnects 171 may be coupled to terminals of the passive component 170. A plurality of solder interconnects 173 may be coupled to the integrated device 172. FIG. 14 illustrates a top plan view of the block device 1107 that includes the metal layer 176. The metal layer 176 is located over a surface of the encapsulation layer 174.

An integrated device (e.g., 104, 172) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 104, 172) may include at least one electronic circuit (e.g., first electronic circuit, second electronic circuit, etc. . . . ). An integrated device may be an example of an electrical component and/or electrical device.

Figure 15A:
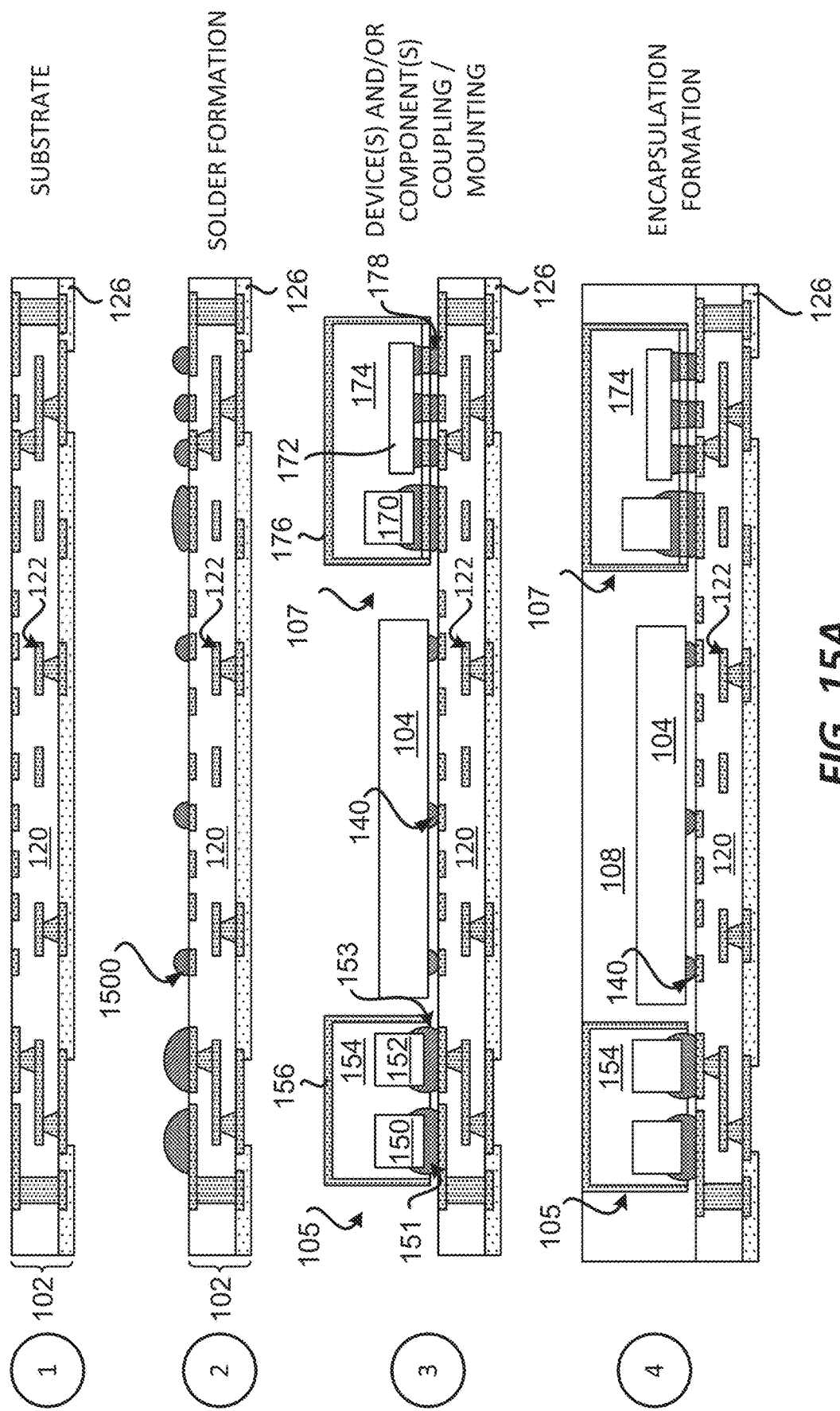
FIGS. 15A-15B illustrate an exemplary sequence for fabricating a package comprising at least one block device and a shield.
Figure 15B:
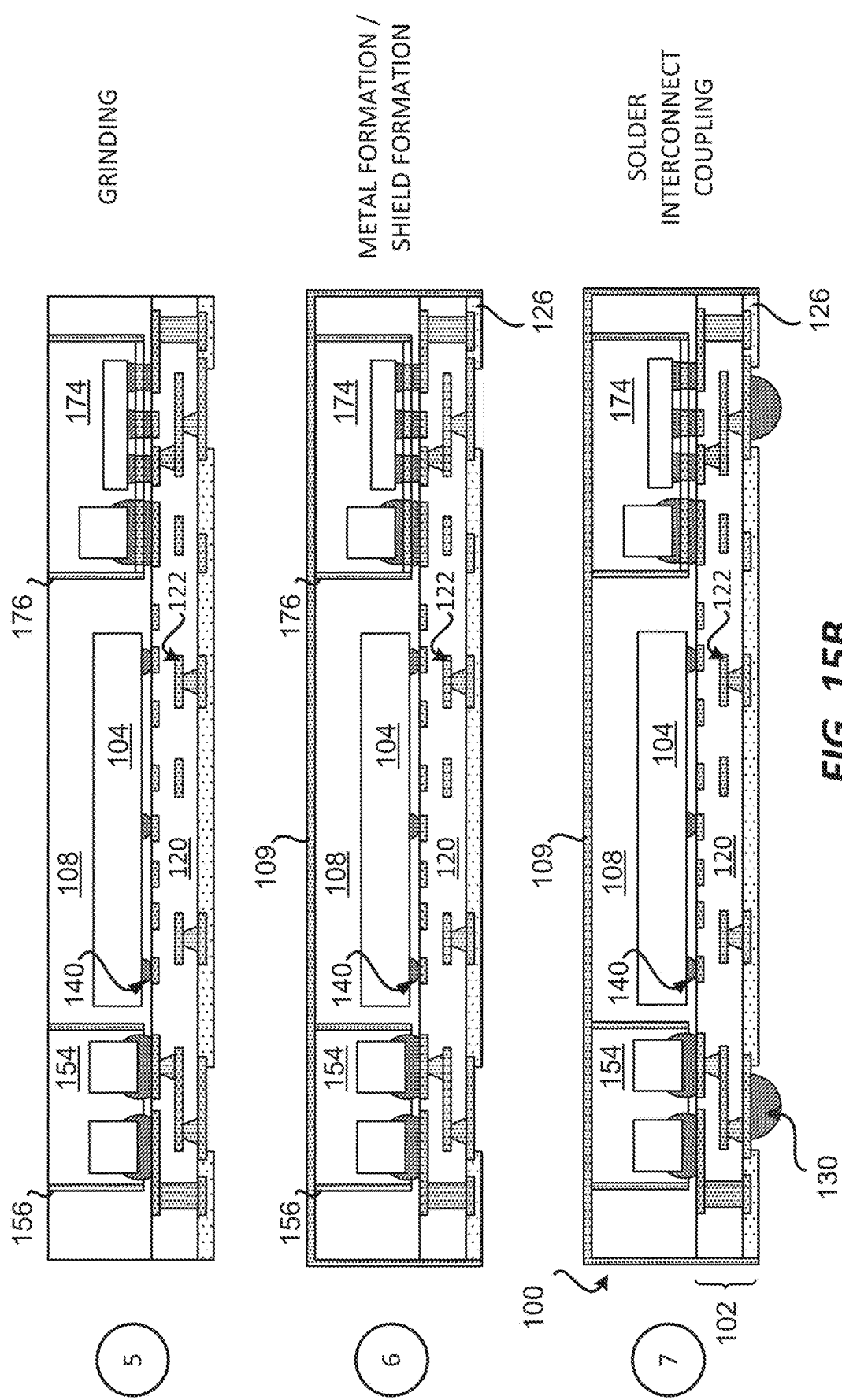

Having described various packages, several methods for fabricating a package will now be described below.
Exemplary Sequence for Fabricating a Package Comprising a Block Device and a Shield In some implementations, fabricating a package includes several processes. FIGS. 15A-15B illustrate an exemplary sequence for providing or fabricating a package. In some implementations, the sequence of FIGS. 15A-15B may be used to provide or fabricate the package 100 of FIG. 1. However, the process of FIGS. 15A-15B may be used to fabricate any of the packages described in the disclosure.

It should be noted that the sequence of FIGS. 15A-15B may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Figure 20A:
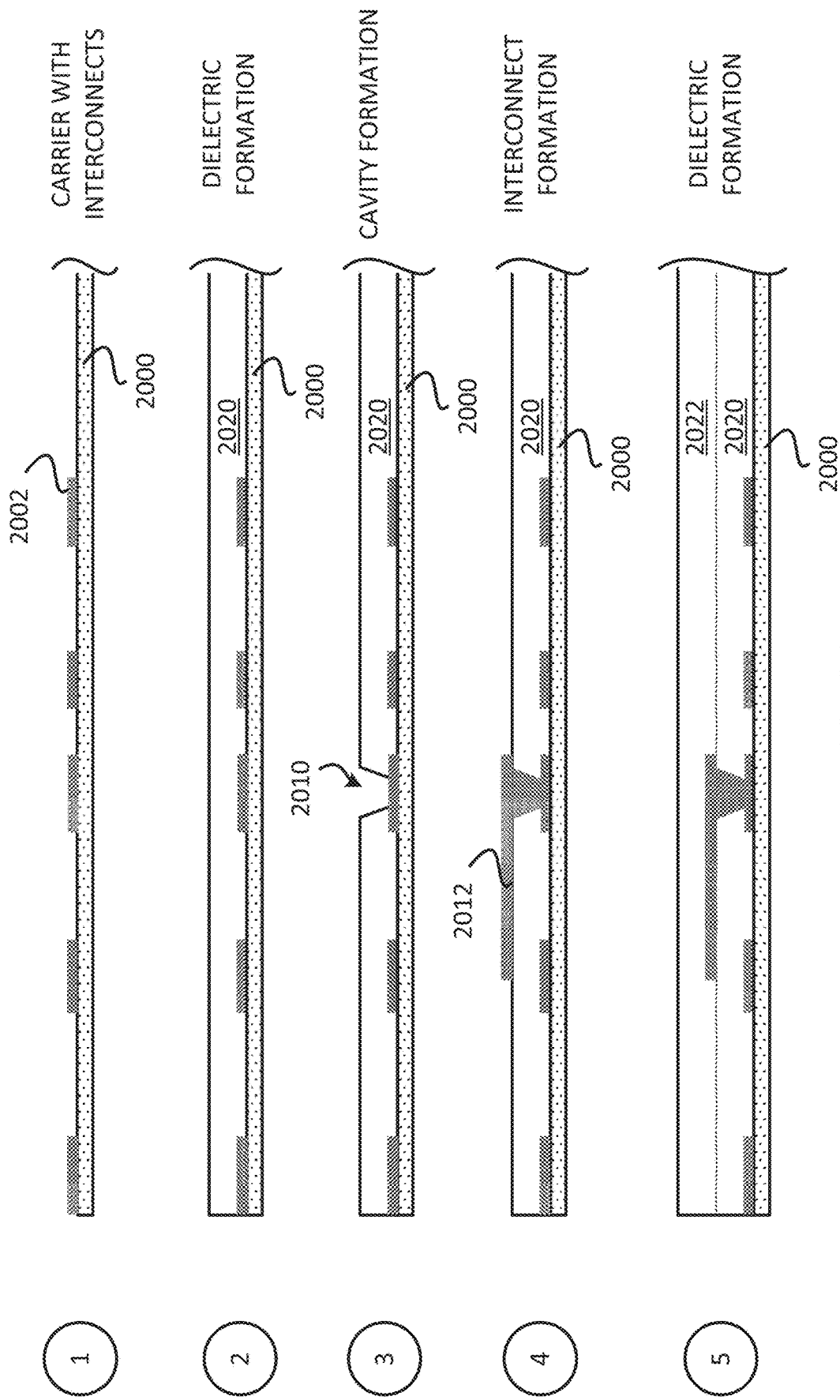
FIGS. 20A-20B illustrate an exemplary sequence for fabricating a substrate.
Figure 20B:
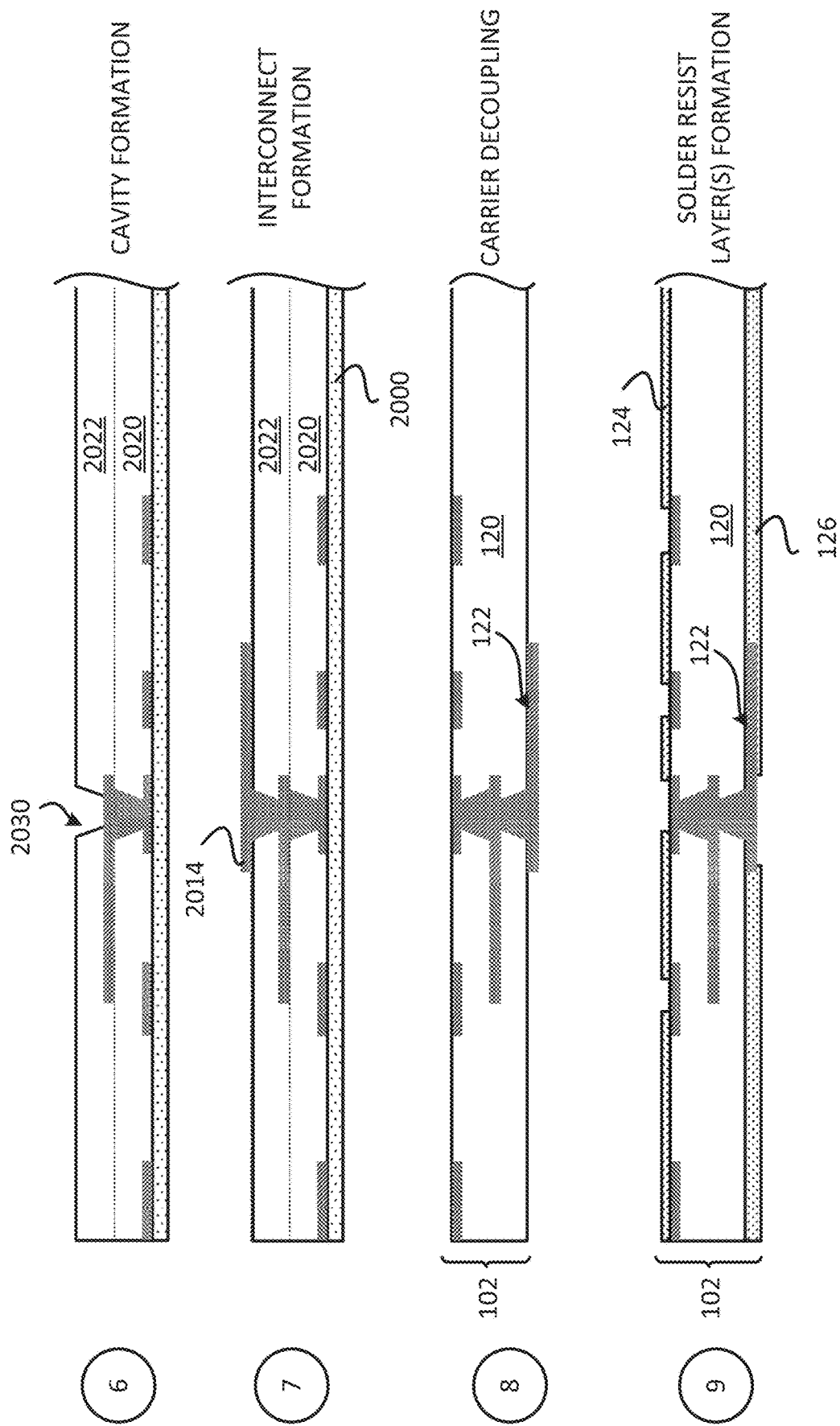

Stage 1, as shown in FIG. 15A, illustrates a state after a substrate 102 is provided. The substrate 102 includes at least one dielectric layer 120, a plurality of interconnects 122 and a solder resist layer 126. Different implementations may use different substrates with different numbers of metal layers. A substrate may include a coreless substrate, a cored substrate, or an embedded trace substrate (ETS). FIGS. 20A-20B illustrate and describe an example of fabricating a substrate.

Stage 2 illustrates a state after a plurality of solder interconnects 1500 is coupled to (e.g., provided over) the substrate 102. The plurality of solder interconnects 1500 may be coupled to at least some of the interconnects from the plurality of interconnects 122. The plurality of solder interconnects 1500 may represent the plurality of solder interconnects 140, 151, 153, and/or 178.

Stage 3 illustrates a state after the integrated device 104, the block device 105, and the block device 107 are coupled to the substrate 102 through the plurality of solder interconnects 1500. The block device 105 may be coupled to the substrate 102 through the plurality of solder interconnects 151 and/or 153. The integrated device 104 may be coupled to the substrate 102 through the plurality of solder interconnects 140. The block device 107 may be coupled to the substrate 102 through the plurality of solder interconnects 178. Different implementations may couple different components and/or devices to the substrate 102. Other components and/or devices may be coupled to the substrate 102. A solder reflow process may be used to couple the integrated device 104, the block device 105, and the block device 107 to the substrate 102.

Stage 4 illustrates a state after an encapsulation layer 108 is provided (e.g., formed) over the substrate 102. The encapsulation layer 108 may encapsulate the block device 105, the integrated device 104 and the block device 107. The encapsulation layer 108 may encapsulate other devices and/or components that are coupled to the substrate 102. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation. As shown at stage 4, the encapsulation layer 108 leaves a top portion of the block device 105 and a top portion of the block device 107 exposed (e.g., not covered by the encapsulation layer 108). In some implementations, the encapsulation layer 108 may be formed such that the encapsulation layer 108 is formed and located over and/or around the top portion of the block device 105 and/or the top portion of the block device 107.

Stage 5, as shown in FIG. 15B, illustrates a state after portions of the block device 105 and portions of the block device 107 have been removed. A grinding process and/or polishing process may remove portions of the block device 105 and/or portions of the block device 107. In some implementations, a top portion of the metal layer 156 of the block device 105 and a top portion of the metal layer 176 of the block device 107 may be removed, exposing the encapsulation layer 154 and the encapsulation layer 174. Portions of the encapsulation layer 154 and/or portions of the encapsulation layer 174 may also be removed. In some implementations, portions of the encapsulation layer 108 may also be removed (for example, when there is an encapsulation layer 108 over the block device 105 and/or the block device 107).

Stage 6 illustrates a state after a metal layer 109 is formed over an outer surface of the encapsulation layer 108. A sputtering process and/or a plating process may be used to form and couple the metal layer 109 to the encapsulation layer 108. The metal layer 109 may be formed over a top surface of the encapsulation layer 108, a surface of the encapsulation layer 154, a surface of the encapsulation layer 174, a side surface of the encapsulation layer 108, and a side surface of the substrate 102. The metal layer 109 may be coupled to the metal layer 156 of the block device 105. The metal layer 109 may be coupled to the metal layer 176 of the block device 107. The metal layer 109 may be configured to be coupled to ground.

Stage 7 illustrates a state after a plurality of solder interconnects 130 is coupled to the substrate 102. A solder reflow process may be used to couple the plurality of solder interconnects 130 to the substrate 102.

The placement of block devices may use surface mounted technology (SMT) to place the block devices in appropriate locations.

Figure 16:
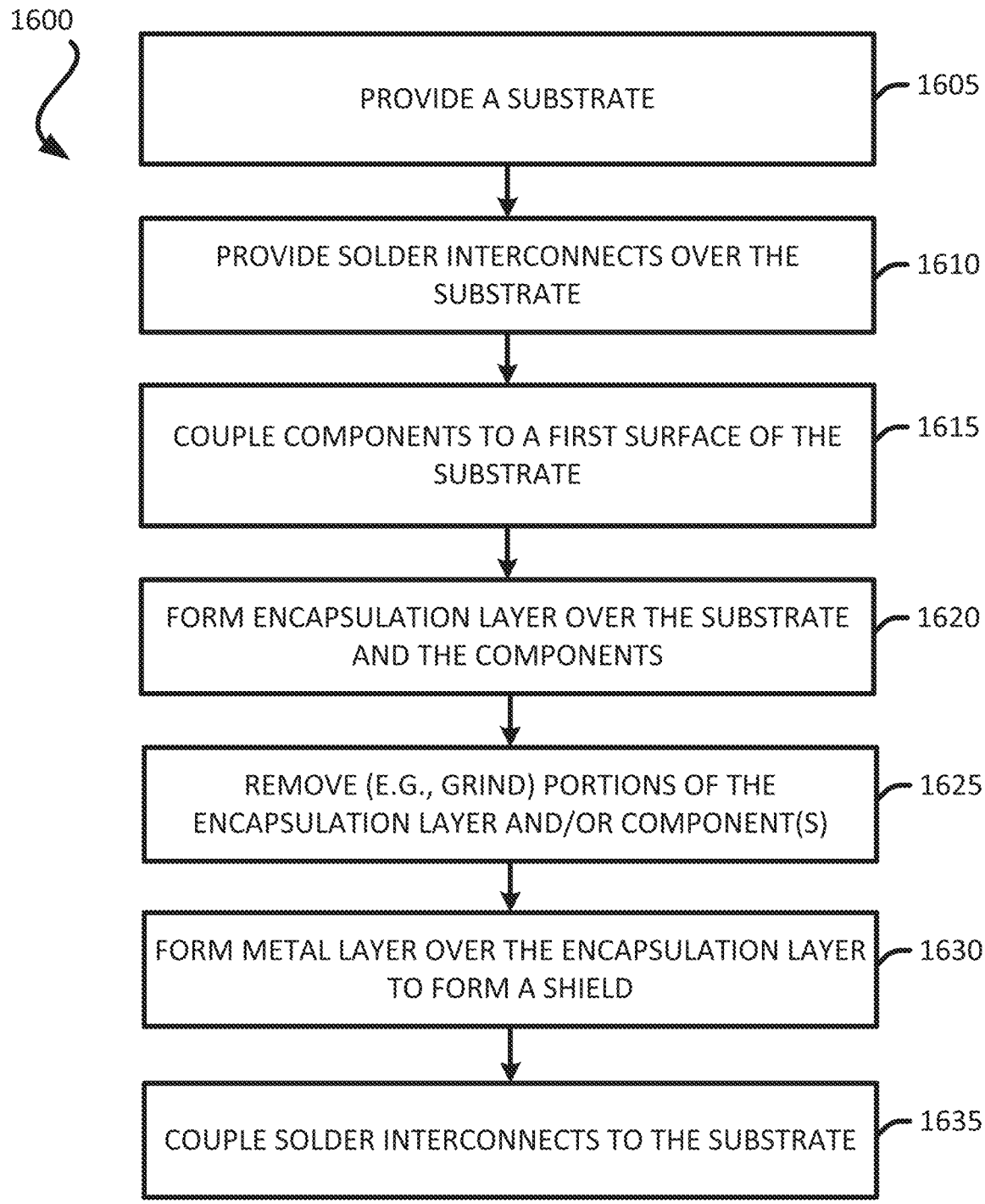
FIG. 16 illustrates an exemplary sequence for fabricating a package comprising at least one block device and a shield.

Exemplary Flow Diagram of a Method for Fabricating a Package Comprising a Block Device and a Shield In some implementations, fabricating a package that includes a block device and a shield includes several processes. FIG. 16 illustrates an exemplary flow diagram of a method 1600 for providing or fabricating a package. In some implementations, the method 1600 of FIG. 16 may be used to provide or fabricate the package 100 of FIG. 1 described in the disclosure. However, the method 1600 may be used to provide or fabricate any of the packages (e.g., 100) described in the disclosure.

It should be noted that the method of FIG. 16 may combine one or more processes in order to simplify and/or clarify the method for providing or fabricating a package. In some implementations, the order of the processes may be changed or modified.

The method provides (at 1605) a substrate (e.g., 102). The substrate 102 may be provided by a supplier or fabricated. A process similar to the process shown in FIGS. 20A-20B may be used to fabricate the substrate 102. However, different implementations may use different processes to fabricate the substrate 102. Examples of processes that may be used to fabricate the substrate 102 include a semi-additive process (SAP) and a modified semi-additive process (mSAP). The substrate 102 includes at least one dielectric layer 120, a plurality of interconnects 122, and a solder resist layer 126. The substrate 102 may include an embedded trace substrate (ETS). In some implementations, the at least one dielectric layer 120 may include prepreg layers. Stage 1 of FIG. 15A illustrates and describes an example of providing a substrate.

The method provides (at 1610) a plurality of solder interconnects (e.g., 1500) over the substrate 102. The plurality of solder interconnects 1500 may be coupled to at least some interconnects from the plurality of interconnects 122. Stage 2 of FIG. 15A illustrates and describes an example of providing solder interconnects.

The method couples (at 1615) components and/or devices to a first surface of the substrate 102. For example, the integrated device 104 is coupled to a first surface (e.g., top surface) of the substrate 102. The integrated device 104 may be coupled to the substrate 102 through a plurality of solder interconnects 140. The block device 105 may be coupled to the first surface of the substrate 102 through a plurality of solder interconnects 151 and/or 153. The block device 107 may be coupled to the first surface of the substrate 102 through a plurality of solder interconnects 178. A solder reflow process may be used to couple the integrated device 104, the block device 105, and the block device 107 to the substrate 102 through the plurality of solder interconnects. Stage 3 of FIG. 15A illustrates and describes an example of coupling at least component and/or device to a substrate.

The method forms (at 1620) an encapsulation layer (e.g., 168) over the substrate (e.g., 102). The encapsulation layer 108 may be provided and formed over and/or around the substrate 102, the integrated device 104, the block device 105 and the block device 107. In some implementations, a top portion of the integrated device 104, the block device 105, and/or the block device 107 may be left exposed. The encapsulation layer 108 may encapsulate the integrated devices(s), the device(s) and/or the component(s). The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation. Stage 4 of FIG. 15A illustrates and describes an example of forming an encapsulation layer.

The method removes (at 1625) portions of the block device 105 and portions of the block device 107. A grinding process and/or polishing process may remove portions of the block device 105 and/or portions of the block device 107. In some implementations, a top portion of the metal layer 156 of the block device 105 and a top portion of the metal layer 176 of the block device 107 may be removed, exposing the encapsulation layer 154 and the encapsulation layer 174. Portions of the encapsulation layer 154 and/or portions of the encapsulation layer 174 may also be removed. In some implementations, portions of the encapsulation layer 108 may also be removed (for example, when there is an encapsulation layer 108 over the block device 105 and/or the block device 107). Stage 5 of FIG. 15B illustrates and describes an example of grinding to remove portions of components and/or an encapsulation layer.

The method forms (at 1630) a metal layer (e.g., 109) over an outer surface of the encapsulation layer 108. A sputtering process and/or a plating process may be used to form and couple the metal layer 109 to the encapsulation layer 108. The metal layer 109 may be formed over a top surface of the encapsulation layer 108, a surface of the encapsulation layer 154, a surface of the encapsulation layer 174, a side surface of the encapsulation layer 108, and a side surface of the substrate 102. The metal layer 109 may be coupled to the metal layer 156 of the block device 105. The metal layer 109 may be coupled to the metal layer 176 of the block device 107. The metal layer 109 may be configured to be coupled to ground.

The method couples (at 1635) a plurality of solder interconnects (e.g., 130) to the substrate 102. A solder reflow process may be used to couple the plurality of solder interconnects 130 to the substrate 102. Stage 7 of FIG. 15B, illustrates and describes an example of coupling solder interconnects to a substrate.

The packages (e.g., 100) described in the disclosure may be fabricated one at a time or may be fabricated together as part of one or more wafers and then singulated into individual packages.

Depending on the design and component requirements, several block assembly configurations can be used, such as tape-assisted molding can be used with a carrier. The block devices may be coupled using SMT assembly rules and can be designed to be compatible with tape and real, and assembly processes. The block devices heights may need to be adjusted to account for target package thickness to allow for electrical connections to be made with the external EMI shield.

Exemplary Sequence for Fabricating a Block Device with a Shield

Figure 17A:
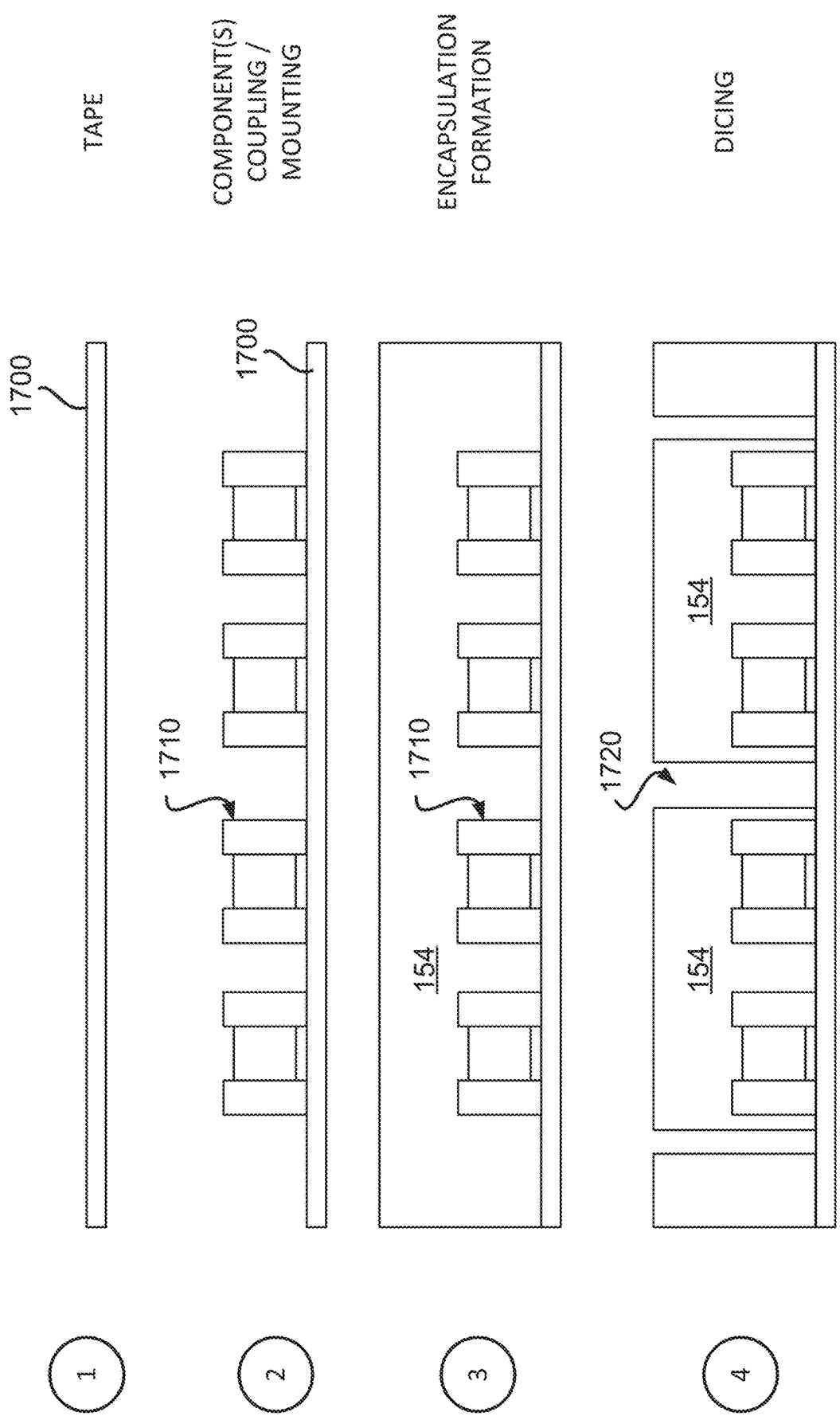
FIGS. 17A-17B illustrate an exemplary sequence for fabricating a block device with a shield.
Figure 17B:
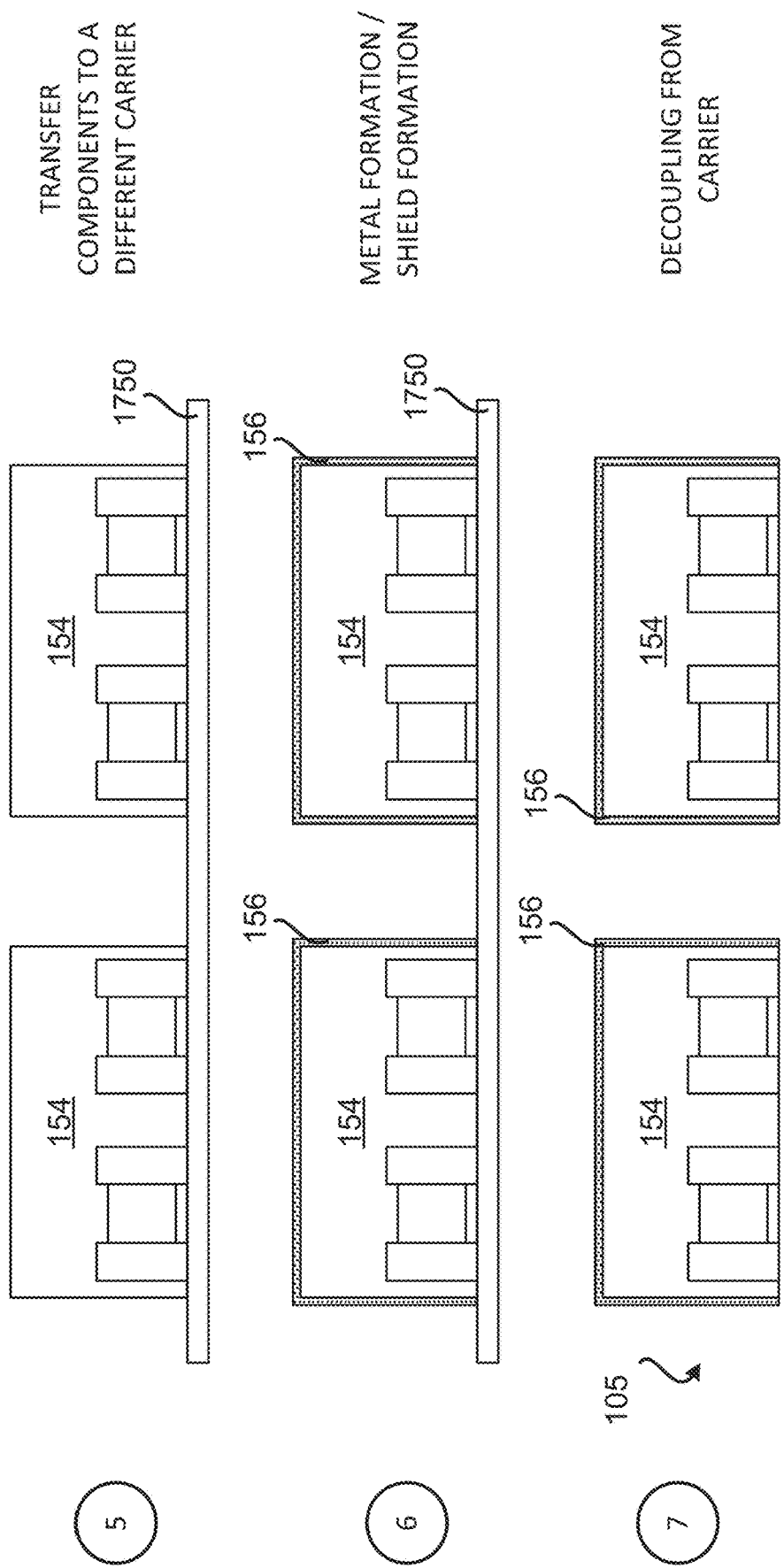

In some implementations, fabricating a block device includes several processes. FIGS. 17A-17B illustrate an exemplary sequence for providing or fabricating a block device. In some implementations, the sequence of FIGS. 17A-17B may be used to provide or fabricate the block device 105. However, the process of FIGS. 17A-17B may be used to fabricate any of the block device described in the disclosure.

It should be noted that the sequence of FIGS. 17A-17B may combine one or more stages in order to simplify and/or clarify the sequence for providing or fabricating a block device. In some implementations, the order of the processes may be changed or modified. In some implementations, one or more of processes may be replaced or substituted without departing from the scope of the disclosure.

Stage 1, as shown in FIG. 17A, illustrates a state after a tape 1700 is provided. The tape 1700 may include an adhesive. It is noted that instead of a tape, another carrier may be used.

Stage 2 illustrates a state after a plurality of passive components 1710 are mounted and coupled to the tape 1700. The plurality of passive components 1710 may represent any of the passive components described in the disclosure, such as the passive components 150, 152, 250 and/or 252. It is noted that other components and/or devices may also be coupled to the tape 1700. For example, the integrated devices (e.g., 104) may be mounted and coupled to the tape 1700.

Stage 3 illustrates a state after an encapsulation layer 154 is formed over the tape 1700. The encapsulation layer 154 may encapsulate the passive components 1710. The encapsulation layer 154 may include a mold, a resin and/or an epoxy. A compression molding process, a transfer molding process, or a liquid molding process may be used to form the encapsulation layer 154.

Stage 4 illustrates a state after the encapsulation layer 154 is cut and/or diced, which creates cut lines 1720 (e.g., cavities) in the encapsulation layer 154. A saw and/or laser may be used to create the cut lines 1720. This creates several discrete block devices with an encapsulation layer and several passive components.

Stage 5, as shown in FIG. 17B, illustrates a state after the discrete block devices with an encapsulation layer and several passive components are decoupled (e.g., removed) from the tape 1700 and transferred to a carrier 1750. The discrete block devices may be placed and coupled to the carrier 1750. It is noted that the transfer to a carrier may be optional.

Stage 6 illustrates a state after a metal layer 156 is formed over the encapsulation layer 154 (e.g., over a surface of the encapsulation layer 154) of the discrete block devices. A sputtering process and/or a plating process may be used to formed the metal layer 156.

Stage 7 illustrates a state after the carrier 1750 is decoupled, leaving behind a plurality of block devices 105, each having a plurality of passive components, an encapsulation layer 154 and a metal layer 156. The metal layer 156 may be configured as an EMI shield.

Exemplary Sequence for Fabricating a Block Device with a Shield

Figure 18A:
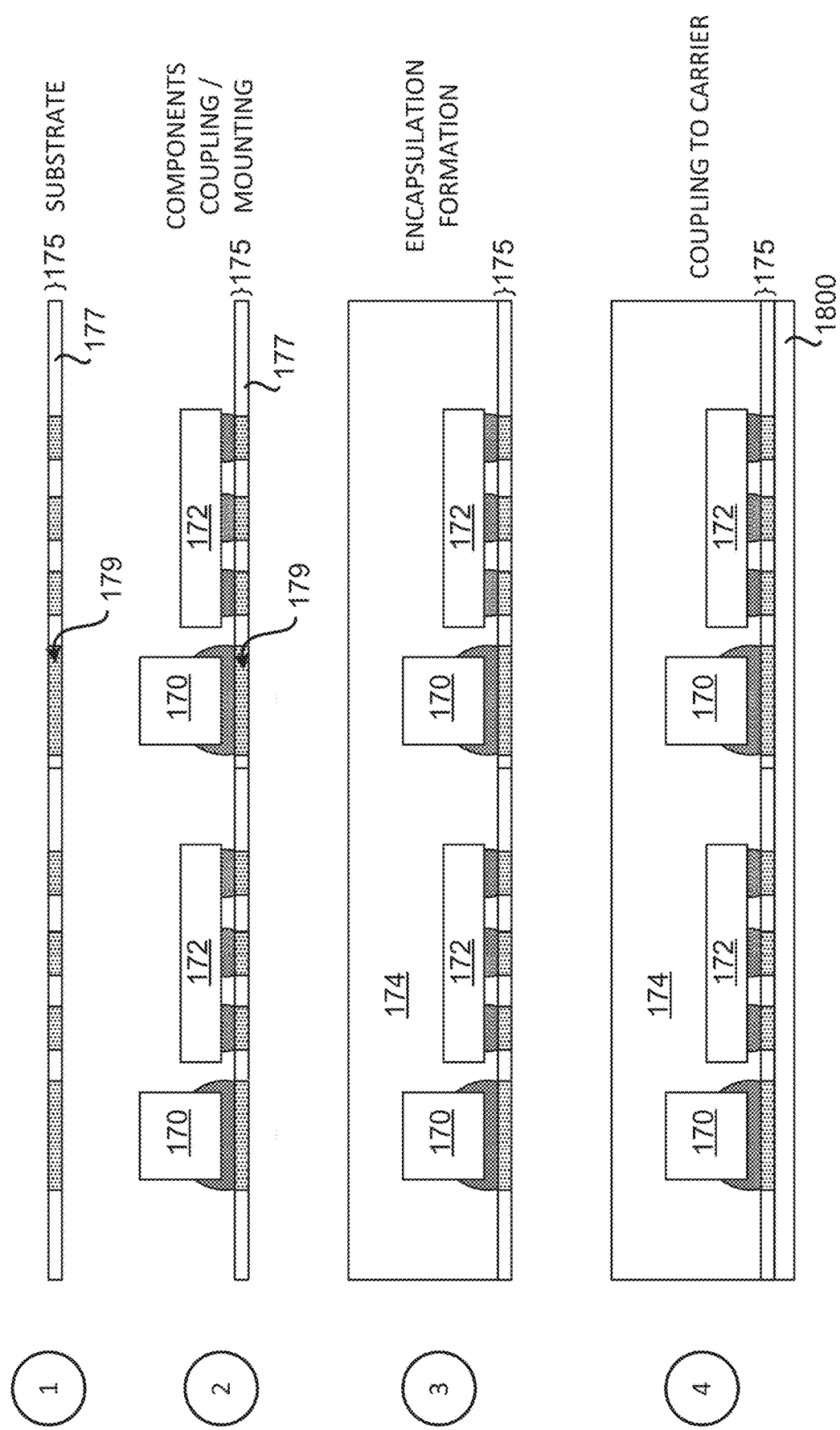
FIGS. 18A-18C illustrate an exemplary sequence for fabricating a block device, a block substrate and a shield.
Figure 18B:
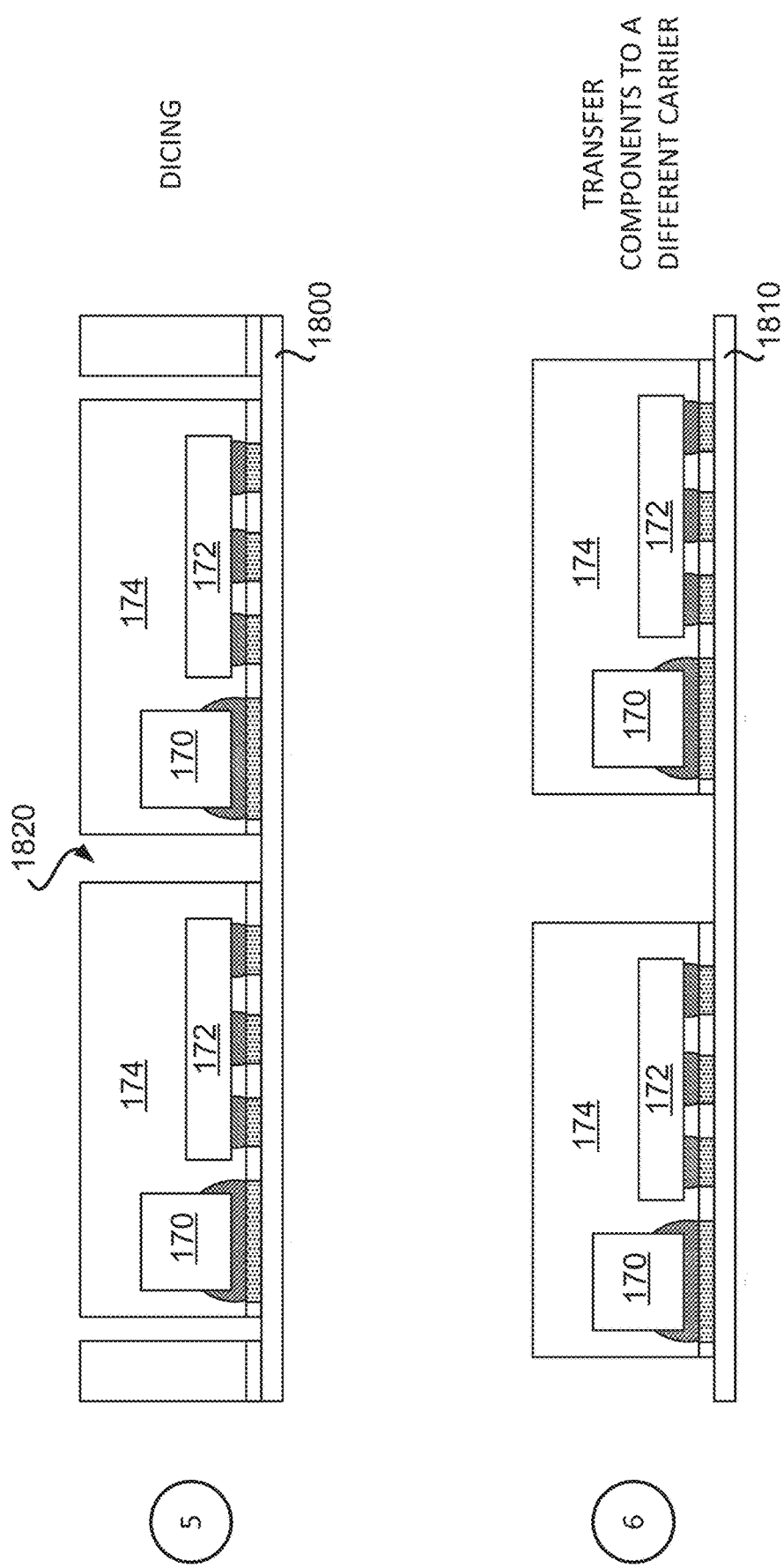
Figure 18C:
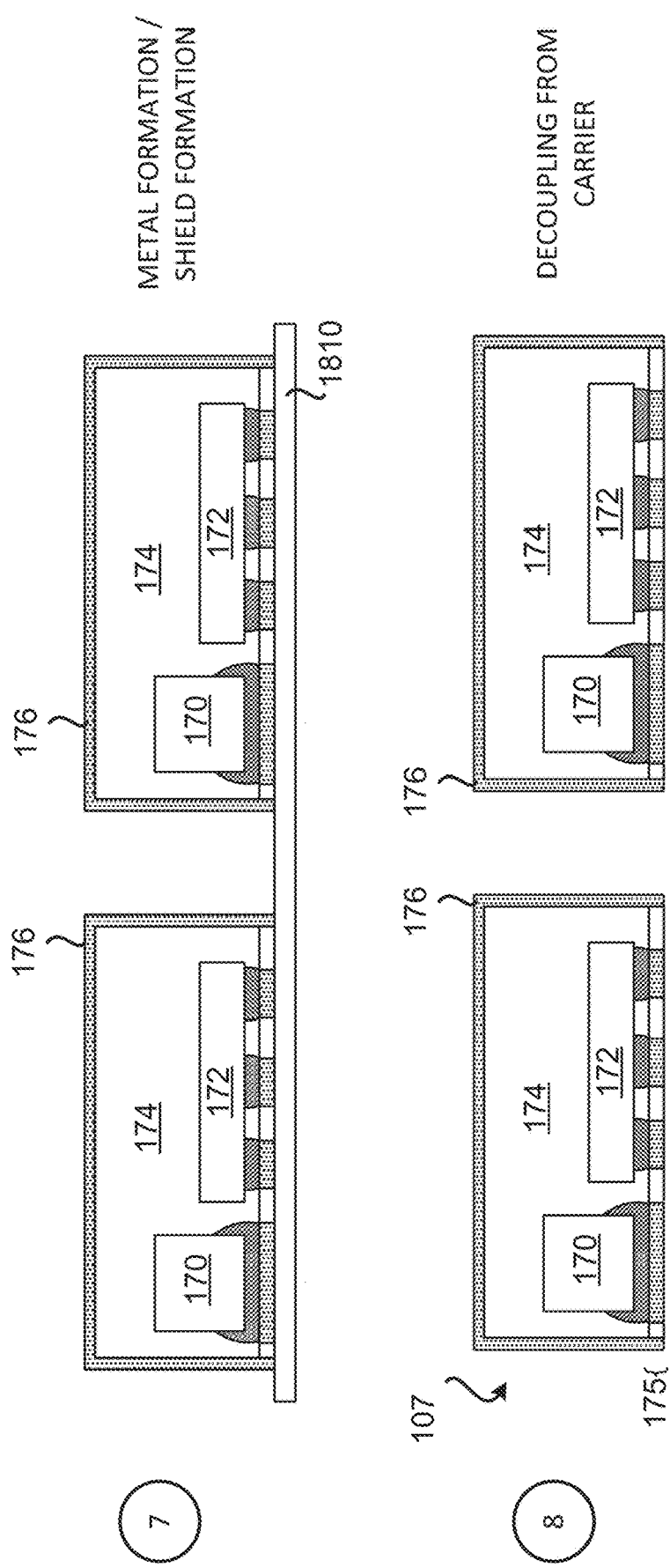

In some implementations, fabricating a block device includes several processes. FIGS. 18A-18C illustrate an exemplary sequence for providing or fabricating a block device. In some implementations, the sequence of FIGS. 18A-18C may be used to provide or fabricate the block device 107. However, the process of FIGS. 18A-18C may be used to fabricate any of the block device described in the disclosure.

It should be noted that the sequence of FIGS. 18A-18C may combine one or more stages in order to simplify and/or clarify the sequence for providing or fabricating a block device. In some implementations, the order of the processes may be changed or modified. In some implementations, one or more of processes may be replaced or substituted without departing from the scope of the disclosure.

Stage 1, as shown in FIG. 18A, illustrates a state after a block substrate 175 is provided. The block substrate 175 may include at least one dielectric layer 177 and a plurality of interconnects 179. Different implementations may use different materials for the at least one dielectric layer 177. For example, the at least one dielectric layer 177 may include prepreg, glass and/or quartz. FIGS. 20A-20B illustrate an example of fabricating a substrate, which may be used to fabricate the block substrate 175.

Stage 2 illustrates a state after a plurality of passive components 170 and a plurality of integrated device 172 are mounted and coupled to the block substrate 175. It is noted that other components and/or devices may also be coupled to the block substrate 175. The plurality of passive components 170 and a plurality of integrated device 172 may be coupled to the block substrate 175 through a plurality of solder interconnects (e.g., 171, 173). A solder reflow process may be used to couple the plurality of passive components 170 and a plurality of integrated device 172 to the block substrate 175.

Stage 3 illustrates a state after an encapsulation layer 174 is formed over the block substrate 175 and the passive components 170 and the integrated devices 172. The encapsulation layer 174 may encapsulate the passive components 170 and the integrated devices 172. The encapsulation layer 174 may include a mold, a resin and/or an epoxy. A compression molding process, a transfer molding process, or a liquid molding process may be used to form the encapsulation layer 174.

Stage 4 illustrates a state after the block substrate 175, the plurality of passive components 170, the plurality of integrated devices 172 and the encapsulation layer 174 are coupled to a carrier 1800.

Stage 5, as shown in FIG. 18B, illustrates a state after the encapsulation layer 174 is cut and/or diced, which creates cut lines 1820 (e.g., cavities) in the encapsulation layer 174. A saw and/or laser may be used to create the cut lines 1820. This creates several discrete block devices with an encapsulation layer and several passive components and/or integrated devices.

Stage 6 illustrates a state after the discrete block devices with an encapsulation layer and several passive components and/or integrated devices, are decoupled (e.g., removed) from the carrier 1800 and transferred to a carrier 1810. The discrete block devices may be placed and coupled to the carrier 1810. It is noted that in some implementations the transfer to another carrier may be optional.

Stage 7 illustrates a state after a metal layer 176 is formed over the encapsulation layer 174 (e.g., over surface of the encapsulation layer 174) of the discrete block devices. A sputtering process and/or a plating process may be used to formed the metal layer 176.

Stage 8 illustrates a state after the carrier 1810 is decoupled, leaving behind a plurality of block devices 107, each having a block substrate 175, at least one passive component, at least one integrated device, an encapsulation layer 174 and a metal layer 176. The metal layer 176 may be configured as an EMI shield. At least part of the block substrate 175 may be configured as an EMI shield.

Figure 19:
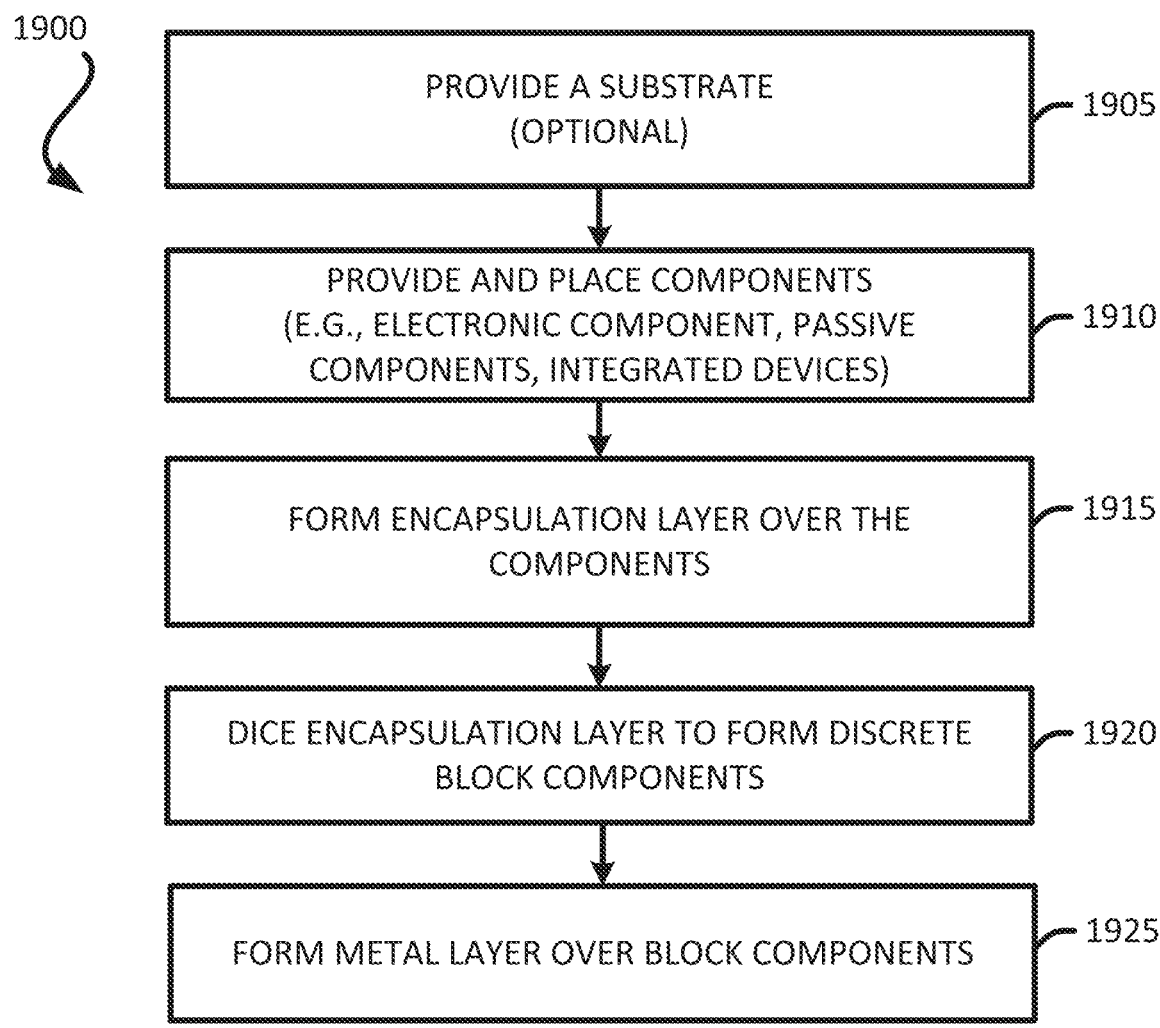
FIG. 19 illustrates an exemplary flow diagram of a method for fabricating a block device with a shield.

Exemplary Flow Diagram of a Method for Fabricating a Package Comprising a Block Device with a Shield In some implementations, fabricating a block device with a shield includes several processes. FIG. 19 illustrates an exemplary flow diagram of a method 1900 for providing or fabricating a block device. In some implementations, the method 1900 of FIG. 19 may be used to provide or fabricate the block device 107 of FIG. 1 described in the disclosure.

The method 1900 will be described with respect to fabricating the block device 107. However, the method 1900 may be used to provide or fabricate any of the block devices (e.g., 105, 107) described in the disclosure.

It should be noted that the method of FIG. 19 may combine one or more processes in order to simplify and/or clarify the method for providing or fabricating a block device. In some implementations, the order of the processes may be changed or modified.

The method may optionally provide (at 1905) a block substrate (e.g., 175). The block substrate 175 may be provided by a supplier or fabricated. The block substrate 175 may include at least one dielectric layer 177 and a plurality of interconnects 179. Stage 1 of FIG. 18A illustrates and describes an example of providing a block substrate.

The method provides and couples (at 1910) at least one passive component (e.g., 170) and/or at least one integrated device (e.g., 172). The at least one passive component and/or the at least one integrated device may be coupled to the block substrate 175, or may be coupled to a tape or carrier. The at least one passive component and/or the at least one integrated device may be examples of electrical components and/or electrical devices. Stage 2 of FIG. 18A illustrates and describes an example of providing and/or coupling at least one passive component and/or at least one integrated device.

The method forms (at 1915) an encapsulation layer (e.g., 174) over the block substrate (e.g., 175), a carrier or a tape. The encapsulation layer 174 may be provided and formed over and/or around the block substrate 175 and the integrated devices (e.g., 172) and/or the passive components (e.g., 170). The encapsulation layer 174 may encapsulate the integrated devices(s) and/or the components. The encapsulation layer 174 may include a mold, a resin and/or an epoxy. A compression molding process, a transfer molding process, or a liquid molding process may be used to form the encapsulation layer 174. The encapsulation layer 174 may be photo etchable. The encapsulation layer 174 may be a means for encapsulation. Stage 4 of FIG. 18A illustrates and describes an example of forming an encapsulation layer.

The method dices (at 1920) the encapsulation layer (e.g., 174), which creates cut lines 1820 (e.g., cavities) in the encapsulation layer 174. A saw and/or laser may be used to create the cut lines 1820. This creates several discrete block devices with an encapsulation layer, passive component(s) and/or integrated device(s). Stage 5 of FIG. 18B illustrates and describes an example of dicing the encapsulation layer. Once the dicing is complete, the method may place (e.g., transfer) discrete block devices on a carrier. Stage 6 of FIG. 18B, illustrates and describes an example of placing discrete block devices on a carrier.

The method forms (at 1925) a metal layer (e.g., 176) over the encapsulation layer 174 of the discrete block devices. The metal layer may be formed and coupled to an outer surface of the encapsulation layer 174. A sputtering process and/or a plating process may be used to formed the metal layer 176. The metal layer 176 may be configured as an EMI shield. Stage 7 of FIG. 18C illustrates and describes an example forming a metal layer. It is noted that during the process of fabricating a block device, various components may be decoupled, transferred, and/or coupled to various tape and/or carrier. The method may then decouple the discrete block devices from a carrier. Stage 8 of FIG. 18C illustrates and describes an example of decoupling block devices from a carrier.

It is noted that the use of proper design rules and dicing tolerances can minimize the risk of voids occurring during discrete block device encapsulation, as well as during package encapsulation.

It is noted that opening the solder mask on the package and proper mold flow can further reduce the risk of mold voids. The block devices may include exposed pads that may be thinner to increase stand-off during package assembly to further reduce risk mold voiding.

Exemplary Sequence for Fabricating a Substrate

In some implementations, fabricating a substrate includes several processes. FIGS. 20A-20B illustrate an exemplary sequence for providing or fabricating a substrate. In some implementations, the sequence of FIGS. 20A-20B may be used to provide or fabricate the substrate 102 of FIG. 1. However, the process of FIGS. 20A-20B may be used to fabricate any of the substrates described in the disclosure.

It should be noted that the sequence of FIGS. 20A-20B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 20A, illustrates a state after a carrier 2000 is provided and a metal layer is formed over the carrier 2000. The metal layer may be patterned to form interconnects 2002. A plating process and etching process may be used to form the metal layer and interconnects. In some implementations, the carrier 2000 may be provided with a metal layer that is patterned to form the interconnects 2002. In some implementations, there may be a seed layer over the carrier 2000. The seed layer may be located between the carrier 2000 and the metal layer that form the interconnects 2002.

Stage 2 illustrates a state after a dielectric layer 2020 is formed over the carrier 2000 and the interconnects 2002. A deposition and/or lamination process may be used to form the dielectric layer 2020. The dielectric layer 2020 may include polyimide. However, different implementations may use different materials for the dielectric layer.

Stage 3 illustrates a state after a plurality of cavities 2010 is formed in the dielectric layer 2020. The plurality of cavities 2010 may be formed using an etching process (e.g., photo etching process) or laser process.

Stage 4 illustrates a state after interconnects 2012 are formed in and over the dielectric layer 2020, including in and over the plurality of cavities 2010. For example, a via, pad and/or traces may be formed. A plating process may be used to form the interconnects.

Stage 5 illustrates a state after another dielectric layer 2022 is formed over the dielectric layer 2020. A deposition and/or lamination process may be used to form the dielectric layer 2022. The dielectric layer 2022 may be the same material as the dielectric layer 2020. However, different implementations may use different materials for the dielectric layer.

Stage 6, as shown in FIG. 20B, illustrates a state after a plurality of cavities 2030 is formed in the dielectric layer 2022. An etching process or laser process may be used to form the cavities 2030.

Stage 7 illustrates a state after interconnects 2014 are formed in and over the dielectric layer 2022, including in and over the plurality of cavities 2030. For example, via, pad and/or trace may be formed. A plating process may be used to form the interconnects.

It is noted that Stages 5 through 7 may be iteratively repeated to form addition metal layers and dielectric layers. Some or all of the interconnects 2002, 2012, and/or 2014 may define a plurality of interconnects 122 of the substrate 102. The dielectric layers 2020, and 2022 may be represented by the at least one dielectric layer 120.

Stage 8 illustrates a state after the carrier 2000 is decoupled (e.g., removed, grinded out) from the at least one dielectric layer 120, leaving the substrate 102 that includes the at least one dielectric layer 120 and the plurality of interconnects 122.

Stage 9 illustrates a state after the solder resist layer 124 and the solder resist layer 126 are formed over the substrate 102. A deposition process may be used to form the solder resist layer 124 and the solder resist layer 126. In some implementations, none or one solder resist layer may be formed over the at least one dielectric layer 120.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 21:
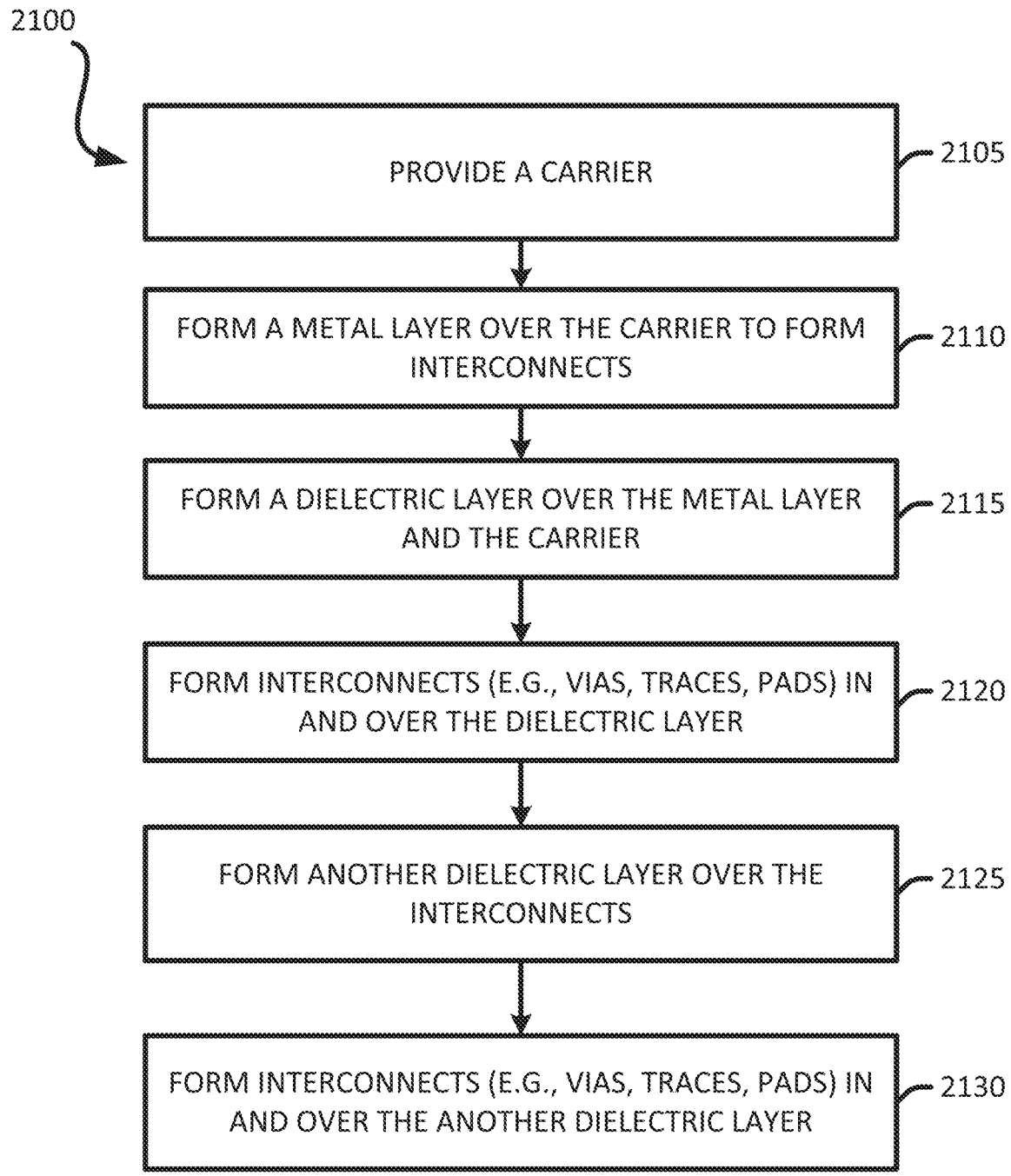
FIG. 21 illustrates an exemplary flow diagram of a method for fabricating a substrate.

In some implementations, fabricating a substrate includes several processes. FIG. 21 illustrates an exemplary flow diagram of a method 2100 for providing or fabricating a substrate. In some implementations, the method 2100 of FIG. 21 may be used to provide or fabricate the substrate(s) of FIG. 1. For example, the method of FIG. 21 may be used to fabricate the substrate 102.

It should be noted that the method 2100 of FIG. 21 may combine one or more processes in order to simplify and/or clarify the method for providing or fabricating a substrate. In some implementations, the order of the processes may be changed or modified.

The method provides (at 2105) a carrier 2000. Different implementations may use different materials for the carrier. The carrier may include a seed layer. The carrier may include a substrate, glass, quartz and/or carrier tape. Stage 1 of FIG. 20A illustrates and describes an example of a carrier that is provided.

The method forms (at 2110) a metal layer over the carrier 2000. The metal layer may be patterned to form interconnects. A plating process may be used to form the metal layer and interconnects. In some implementations, the carrier may include a metal layer. The metal layer over the carrier may be patterned to form interconnects (e.g., 2002). Stage 1 of FIG. 20A illustrates and describes an example of a metal layer and interconnects that are formed over a carrier.

The method forms (at 2115) a dielectric layer 2020 over the carrier 2000 and the interconnects 2002. A deposition and/or lamination process may be used to form the dielectric layer. The dielectric layer 2020 may include polyimide. Forming the dielectric layer may also include forming a plurality of cavities (e.g., 2010) in the dielectric layer 2020. The plurality of cavities may be formed using an etching process (e.g., photo etching) or laser process. Stages 2-3 of FIG. 20A illustrate and describe an example of forming a dielectric layer and cavities in the dielectric layer.

The method forms (at 2120) interconnects in and over the dielectric layer. For example, the interconnects 2012 may be formed in and over the dielectric layer 2020. A plating process may be used to form the interconnects. Forming interconnects may include providing a patterned metal layer over and/or in the dielectric layer. Forming interconnects may also include forming interconnects in cavities of the dielectric layer. Stage 4 of FIG. 20A illustrates and describes an example of forming interconnects in and over a dielectric layer.

The method forms (at 2125) a dielectric layer 2022 over the dielectric layer 2020 and the interconnects. A deposition and/or lamination process may be used to form the dielectric layer. The dielectric layer 2022 may include polyimide. Forming the dielectric layer may also include forming a plurality of cavities (e.g., 2030) in the dielectric layer 2022. The plurality of cavities may be formed using an etching process or laser process. Stages 5-6 of FIGS. 20A-20B illustrate and describe an example of forming a dielectric layer and cavities in the dielectric layer.

The method forms (at 2130) interconnects in and/or over the dielectric layer. For example, the interconnects 2014 may be formed. A plating process may be used to form the interconnects. Forming interconnects may include providing a patterned metal layer over an in the dielectric layer. Forming interconnects may also include forming interconnects in cavities of the dielectric layer. Stage 15 of FIG. 20B illustrates and describes an example of forming interconnects in and over a dielectric layer.

The method may form additional dielectric layer(s) and additional interconnects as described at 2125 and 2130.

Once all the dielectric layer(s) and additional interconnects are formed, the method may decouple (e.g., remove, grind out) the carrier (e.g., 2000) from the dielectric layer 2020, leaving the substrate. In some implementations, the method may form solder resist layers (e.g., 124, 126) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Electronic Devices

Figure 22:
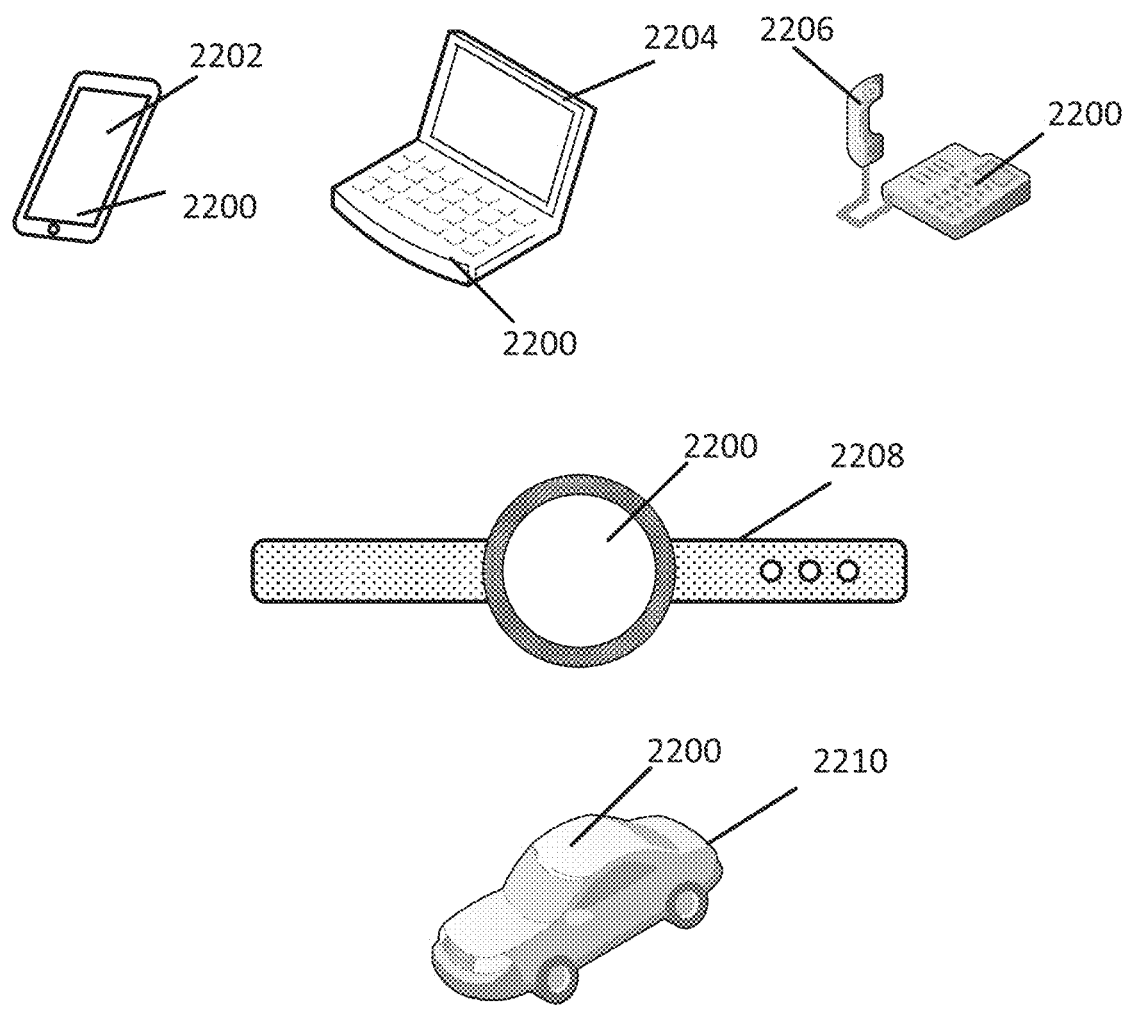
FIG. 22 illustrates various electronic devices that may integrate a die, an electronic circuit, an integrated device, an integrated passive device (IPD), a passive component, a package, and/or a device package described herein.

FIG. 22 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 2202, a laptop computer device 2204, a fixed location terminal device 2206, a wearable device 2208, or automotive vehicle 2210 may include a device 2200 as described herein. The device 2200 may be, for example, any of the devices and/or integrated circuit (IC) packages described herein. The devices 2202, 2204, 2206 and 2208 and the vehicle 2210 illustrated in FIG. 22 are merely exemplary. Other electronic devices may also feature the device 2200 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-14, 15A-15B, 16, 17A-17B, 18A-18C, and/or 19-22 may be rearranged and/or combined into a single component, process, feature or function or embodied in several components, processes, or functions. Additional elements, components, processes, and/or functions may also be added without departing from the disclosure. It should also be noted FIGS. 1-14, 15A-15B, 16, 17A-17B, 18A-18C, and/or 19-22 and its corresponding description in the present disclosure is not limited to dies and/or ICs. In some implementations, FIGS. 1-14, 15A-15B, 16, 17A-17B, 18A-18C, and/or 19-22 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising: a substrate; a first integrated device coupled to the substrate; a first block device coupled to the substrate, the first block device comprising: a first electrical component; a second electrical component; a first encapsulation layer encapsulating the first electrical component and the second electrical component; and a first metal layer coupled to the first encapsulation layer; and a second encapsulation layer at least partially encapsulating the first integrated device and the first block device.

Aspect 2: The package of aspect 1, further comprising a second metal layer coupled to the second encapsulation layer, wherein the second metal layer is located over an outer surface of the second encapsulation layer.

Aspect 3: The package of aspect 2, wherein the second metal layer is coupled to the first metal layer of the first block device.

Aspect 4: The package of aspects 2 through 3, wherein the first metal layer and/or the second metal layer is configured as an electromagnetic interference (EMI) shield.

Aspect 5: The package of aspects 2 through 4, wherein the first metal layer and/or the second metal layer is configured to couple to ground.

Aspect 6: The package of aspects 1 through 5, wherein the first block device further comprises a block substrate, and wherein the first electrical component and the second electrical component are coupled to the block substrate.

Aspect 7: The package of aspects 1 through 6, wherein the first electrical component includes a passive component or an integrated device, and wherein the second electrical component includes another passive component or another integrated device.

Aspect 8: The package of aspects 1 through 7, wherein the first block device includes more than two electrical components.

Aspect 9: The package of aspects 1 through 8, further comprising a second block device coupled to the substrate, the second block device comprising: a third electrical component; a fourth electrical component; a third encapsulation layer encapsulating the third electrical component and the fourth electrical component; and a third metal layer coupled to the third encapsulation layer, wherein the third metal layer is configured as a shield for the second block device.

Aspect 10: The package of aspects 1 through 9, wherein the first block device is coupled to the substrate through a plurality of solder interconnects.

Aspect 11: An apparatus comprising: a substrate; a first integrated device coupled to the substrate; a first block device coupled to the substrate, the first block device comprising: a first electrical component; a second electrical component; means for first encapsulation configured to encapsulate the first electrical component and the second electrical component; and a first metal layer coupled to the means for first encapsulation; and means for second encapsulation configured to at least partially encapsulate the first integrated device and the first block device.

Aspect 12: The apparatus of aspect 11, further comprising a second metal layer coupled to the means for second encapsulation, wherein the second metal layer is located over an outer surface of the means for second encapsulation.

Aspect 13: The apparatus of aspect 12, wherein the second metal layer is coupled to the first metal layer of the first block device.

Aspect 14: The apparatus of aspects 12 through 13, wherein the first metal layer and/or the second metal layer is configured as an electromagnetic interference (EMI) shield.

Aspect 15: The apparatus of aspects 12 through 14, wherein the first metal layer and/or the second metal layer is configured to couple to ground.

Aspect 16: The apparatus of aspects 11 through 15, wherein the first block device further comprises a block substrate, and wherein the first electrical component and the second electrical component are coupled to the block substrate.

Aspect 17: The apparatus of aspects 11 through 16, wherein the first electrical component includes a passive component or an integrated device, and wherein the second electrical component includes another passive component or another integrated device.

Aspect 18: The apparatus of aspects 11 through 17, wherein the first block device includes more than two electrical components.

Aspect 19: The apparatus of aspects 11 through 18, further comprising a second block device coupled to the substrate, the second block device comprising: a third electrical component; a fourth electrical component; means for third encapsulation configured to encapsulate the third electrical component and the fourth electrical component; and a third metal layer coupled to the means for third encapsulation, wherein the third metal layer is configured as a shield for the second block device.

Aspect 20: The apparatus of aspects 11 through 19, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 21: A method for fabricating a package, comprising: providing a substrate; coupling a first integrated device to the substrate; coupling a first block device to the substrate, the first block device comprising: a first electrical component; a second electrical component; a first encapsulation layer encapsulating the first electrical component and the second electrical component; and a first metal layer coupled to the first encapsulation layer; and forming a second encapsulation layer that at least partially encapsulates the first integrated device and the first block device.

Aspect 22: The method of aspect 21, further comprising forming a second metal layer over an outer surface of the second encapsulation layer.

Aspect 23: The method of aspect 22, wherein the second metal layer is coupled to the first metal layer of the first block device.

Aspect 24: The method of aspects 22 through 23, wherein the first metal layer and/or the second metal layer is configured as an electromagnetic interference (EMI) shield.

Aspect 25: The method of aspects 21 through 24, wherein the first block device further comprises a block substrate, and wherein the first electrical component and the second electrical component are coupled to the block substrate.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate;
a first integrated device coupled to the substrate;
a first block device coupled to the substrate through a first plurality of solder interconnects, the first block device comprising:
a first electrical component;
a second electrical component;
a first encapsulation layer encapsulating the first electrical component and the second electrical component, wherein the first encapsulation layer comprises a first surface; and
a first metal layer coupled to and touching a lateral surface of the first encapsulation layer, wherein an entire portion of the first metal layer of the first block device, between a second metal layer and a bottom portion of the first block device, extends along a vertical plane;
a second encapsulation layer at least partially encapsulating the first integrated device and the first block device, wherein the second encapsulation layer comprises a second surface that shares a same horizontal plane as the first surface of the first encapsulation layer;
the second metal layer located at least over the first block device, directly coupled to and touching (i) the first surface of the first encapsulation layer of the first block device, (ii) the second surface of the second encapsulation layer, and (iii) the first metal layer; and
a second block device coupled to the substrate, wherein the second block device comprises:
a third electrical component;
a third encapsulation layer encapsulating the third electrical component, wherein the third encapsulation layer comprises a third surface that shares the same horizontal plane as (i) the first surface of the first encapsulation layer and (ii) the second surface of the second encapsulation layer; and
a third metal layer coupled to and touching (i) a lateral surface of the third encapsulation layer and (ii) the second metal layer, wherein the third metal layer is configured as a shield for the second block device.

2. The package of claim 1, wherein the second metal layer is located over the second encapsulation layer.

3. The package of claim 1, wherein the entire portion of the first metal layer of the first block device, along the vertical plane, is coupled to and touching the first encapsulation layer and the second encapsulation layer.

4. The package of claim 1, wherein the first metal layer and/or the second metal layer is configured as an electromagnetic interference (EMI) shield.

5. The package of claim 1, wherein the first metal layer and/or the second metal layer is configured to couple to ground.

6. The package of claim 1,
wherein the first block device further comprises a block substrate, and
wherein the first electrical component and the second electrical component are coupled to the block substrate through a second plurality of solder interconnects.

7. The package of claim 1,
wherein the first electrical component includes a passive component or an integrated device, and
wherein the second electrical component includes another passive component or another integrated device.

8. The package of claim 1, wherein the first block device includes more than two electrical components.

9. The package of claim 1, wherein between the second metal layer and a bottom portion of the first block device, the entire portion of the first metal layer touches (i) the first encapsulation layer and the second encapsulation layer, and/or (ii) a substrate of the first block device and the second encapsulation layer.

10. The package of claim 1, wherein the second encapsulation layer extends horizontally between a first vertical portion of the first metal layer and a vertical portion of the second metal layer.

11. The package of claim 2, wherein the second metal layer is coupled to outer side walls of the second encapsulation layer, the second metal layer extending to side walls of the substrate.

12. The package of claim 10, wherein the second encapsulation layer extends horizontally between a second vertical portion of the first metal layer and a side wall of the first integrated device.

13. The package of claim 12, wherein the second encapsulation layer extends horizontally between another side wall of the first integrated device and another vertical portion of the second metal layer.

14. An apparatus comprising:
a substrate;
a first integrated device coupled to the substrate;
a first block device coupled to the substrate through a first plurality of solder interconnects, the first block device comprising:
 a first electrical component;
 a second electrical component;
 means for first encapsulation configured to encapsulate the first electrical component and the second electrical component, wherein the means for first encapsulation comprises a first surface;
 a first metal layer coupled to and touching a lateral surface of the means for first encapsulation, wherein an entire portion of the first metal layer of the first block device, between a second metal layer and a bottom portion of the first block device, extends along a vertical plane;
means for second encapsulation configured to at least partially encapsulate the first integrated device and the first block device, wherein the means for second encapsulation comprises a second surface that shares a same horizontal plane as the first surface of the means for first encapsulation;
the second metal layer located at least over the first block device, directly coupled to and touching (i) the first surface of the means for first encapsulation of the first block device, (ii) the second surface of the means for second encapsulation, and (iii) the first metal layer; and
a second block device coupled to the substrate, wherein the second block device comprises:
 a third electrical component;
 means for third encapsulation configured to encapsulate the third electrical component; and
 a third metal layer coupled to and touching a lateral surface of the means for third encapsulation,
 wherein an entire portion of the third metal layer of the second block device, between the second metal layer and a bottom portion of second block device, extends along another vertical plane, and
 wherein the third metal layer is configured as a shield for the second block device.

15. The apparatus of claim 14, wherein the second metal layer is located over the means for second encapsulation.

16. The apparatus of claim 14, wherein the entire portion of the first metal layer of the first block device, along the vertical plane, is coupled to and touching the means for first encapsulation and the means for second encapsulation layer.

17. The apparatus of claim 14, wherein the first metal layer and/or the second metal layer is configured as an electromagnetic interference (EMI) shield.

18. The apparatus of claim 14, wherein the first metal layer and/or the second metal layer is configured to couple to ground.

19. The apparatus of claim 14,
wherein the first block device further comprises a block substrate, and
wherein the first electrical component and the second electrical component are coupled to the block substrate through a second plurality of solder interconnects.

20. The apparatus of claim 14,
wherein the first electrical component includes a passive component or an integrated device, and
wherein the second electrical component includes another passive component or another integrated device.

21. The apparatus of claim 14, wherein the first block device includes more than two electrical components.

22. The apparatus of claim 14, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

23. A method for fabricating a package, comprising:
providing a substrate;
coupling a first integrated device to the substrate;
coupling a first block device to the substrate through a first plurality of solder interconnects, the first block device comprising:
 a first electrical component;
 a second electrical component;
 a first encapsulation layer encapsulating the first electrical component and the second electrical component, wherein the first encapsulation layer comprises a first surface;
 a first metal layer coupled to and touching a lateral surface the first encapsulation layer, wherein an entire portion of the first metal layer of the first block device, between a second metal layer and a bottom portion of the first block device, extends along a vertical plane;
forming a second encapsulation layer that at least partially encapsulates the first integrated device and the first block device, wherein the second encapsulation layer comprises a second surface that shares a same horizontal plane as the first surface of the first encapsulation layer;
forming the second metal layer at least over the first block device, directly coupled to and touching (i) the first surface of the first encapsulation layer of the first block device, (ii) the second surface of the second encapsulation layer, and (iii) the first metal layer; and
coupling a second block device to the substrate, the second block device comprising:
 a third electrical component;
 a third encapsulation layer encapsulating the third electrical component, wherein the third encapsulation layer comprises a third surface that shares the same horizontal plane as (i) the first surface of the first encapsulation layer and (ii) the second surface of the second encapsulation layer; and
 a third metal layer coupled to and touching (i) a lateral surface of the third encapsulation layer and (ii) the second metal layer, wherein the third metal layer is configured as a shield for the second block device.

24. The method of claim 23, wherein the second metal layer is located over an outer surface of the second encapsulation layer.

25. The method of claim 23, wherein the entire portion of the first metal layer of the first block device, along the vertical plane, is coupled to and touching the first encapsulation layer and the second encapsulation layer.

26. The method of claim 23, wherein the first metal layer and/or the second metal layer is configured as an electromagnetic interference (EMI) shield.

27. The method of claim 23,
wherein the first block device further comprises a block substrate, and
wherein the first electrical component and the second electrical component are coupled to the block substrate through a second plurality of solder interconnects.

* * * * *